(12) United States Patent
Yamane et al.

(10) Patent No.: US 10,332,666 B2
(45) Date of Patent: Jun. 25, 2019

(54) MAGNETORESISTANCE EFFECT DEVICE AND HIGH FREQUENCY DEVICE

(71) Applicant: TDK CORPORATION, Tokyo (JP)

(72) Inventors: Takekazu Yamane, Tokyo (JP); Junichiro Urabe, Tokyo (JP); Tsuyoshi Suzuki, Tokyo (JP); Atsushi Shimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/962,286

(22) Filed: Apr. 25, 2018

(65) Prior Publication Data

US 2018/0315535 A1 Nov. 1, 2018

(30) Foreign Application Priority Data

Apr. 27, 2017 (JP) ................................ 2017-088448

(51) Int. Cl.
*H01F 10/32* (2006.01)
*H03H 11/04* (2006.01)
(Continued)

(52) U.S. Cl.
CPC ............ *H01F 10/329* (2013.01); *G11C 11/02* (2013.01); *H01F 10/3259* (2013.01);
(Continued)

(58) Field of Classification Search
CPC .... H01F 10/329; H01F 10/3259; H01P 1/218; H03H 2/00; H03H 11/04; G11C 11/02;
(Continued)

(56) References Cited

U.S. PATENT DOCUMENTS

| | | | | |
|---|---|---|---|---|
| 6,123,781 A | * | 9/2000 | Shimazawa | ............ B82Y 10/00 148/103 |
| 2014/0177328 A1 | * | 6/2014 | Gerber | .................. G11C 11/161 365/158 |

(Continued)

OTHER PUBLICATIONS

Tulapurkar, A.A. et al., "Spin-torque diode effect in magnetic tunnel junctions.", Nature, vol. 438, No. 7066, pp. 339-342, (2005).

(Continued)

*Primary Examiner* — Tan T. Nguyen
(74) *Attorney, Agent, or Firm* — Oliff PLC

(57) ABSTRACT

The magnetoresistance effect device includes: a first port; a second port; a magnetoresistance effect element; a first signal line that is connected to the first port and applies a high frequency magnetic field to the magnetoresistance effect element; a second signal line that connects the second port and the magnetoresistance effect element to each other; and a direct current application terminal capable of being connected to a power supply that applies a direct current or a direct current voltage. The first signal line includes a magnetic field generator, which extends in a first direction, at a position in the lamination direction of the magnetoresistance effect element or an in-plane direction that is orthogonal to the lamination direction, and the magnetic field generator and the magnetoresistance effect element include an overlapping portion as viewed from the lamination direction in which the magnetic field generator is disposed, or the in-plane direction.

18 Claims, 13 Drawing Sheets

(51) Int. Cl.
  *G11C 11/02* (2006.01)
  *H01P 1/218* (2006.01)
  *H03H 2/00* (2006.01)
  *G11C 11/16* (2006.01)
  *G11C 11/15* (2006.01)

(52) U.S. Cl.
  CPC .............. *H01P 1/218* (2013.01); *H03H 2/00* (2013.01); *H03H 11/04* (2013.01); *G11C 11/15* (2013.01); *G11C 11/16* (2013.01); *G11C 11/1673* (2013.01); *G11C 11/1675* (2013.01); *H01F 10/325* (2013.01); *H01F 10/3254* (2013.01)

(58) Field of Classification Search
  CPC ......... G11C 11/15; G11C 11/16; G11C 11/22; G11C 11/1673; G11C 16/75; G11C 11/2273
  USPC ................................. 365/158, 157, 171, 173
  See application file for complete search history.

(56) References Cited

U.S. PATENT DOCUMENTS

2015/0357015 A1* 12/2015 Kent ...................... G11C 11/16
   365/158
2017/0244377 A1  8/2017 Yamane et al.

OTHER PUBLICATIONS

Kalarickal, Sangita S. et al., "Ferromagnetic resonance linewidth in metallic thin films: Comparison of measurement methods.", Journal of Applied Physics 99, pp. 093909-1 to 093909-7, (2006).

Bilzer, C. et al., "Vector network analyzer ferromagnetic resonance of thin films on coplanar waveguides: Comparison of different evaluation methods.", Journal of Applied Physics 101, pp. 074505-1 to 074505-5, (2007).

Schumacher, H.W. et al., "Precessional switching of the magnetization in microscopic magnetic tunnel junctions (invited).", Journal of Applied Physics, vol. 93, No. 10, pp. 7290-7294, (2003).

Beaujour, J.-M. L. et al., "Ferromagnetic resonance study of polycrystalline cobalt ultrathin films.", Journal of Applied Physics 99, pp. 08N503-1 to 08N503-3, (2006).

\* cited by examiner

MAGNETORESISTANCE EFFECT DEVICE AND HIGH FREQUENCY DEVICE

BACKGROUND OF THE INVENTION

Field of the Invention

The present invention relates to magnetoresistance effect device and a high frequency device.

Priority is claimed on Japanese Patent Application No. 2017-088448, filed on Apr. 27, 2017, the content of which is incorporated herein by reference.

Description of Related Art

In recent years, along with higher functionality of mobile communication terminals such cellular phones, an increase in radio communication speed has been progressing. Communication speeds are proportional to a bandwidth of a frequency that is used, and thus frequency bands necessary for communication have been increased. Along with this, the number of high frequency filters that need to be mounted on the mobile communication terminals has also been increasing.

In addition, in recent years, spintronics has been examined as a field capable of being applied to new high frequency components. As one phenomenon that has attracted attention, ferromagnetic resonance by a magnetoresistance effect element can be exemplified (refer to Journal of Applied Physics 99, 08 N503, 17 Nov. 2006).

It is possible to cause ferromagnetic resonance in the magnetoresistance effect element by causing an alternating current to flow to the magnetoresistance effect element, and by applying a magnetic field thereto by using a magnetic field applying mechanism. When the ferromagnetic resonance occurs, a resistance value of the magnetoresistance effect element periodically oscillates at a frequency corresponding to a ferromagnetic resonance frequency. The ferromagnetic resonance frequency of the magnetoresistance effect element varies in accordance with the intensity of the magnetic field that is applied to the magnetoresistance effect element. Typically, the resonance frequency is a high frequency band of several GHz to several tens of GHz.

SUMMARY OF THE INVENTION

As described above, examination of a high frequency oscillation element using the ferromagnetic resonance phenomenon has progressed. However, it cannot be said that specific examination for other application uses of the ferromagnetic resonance phenomenon is sufficient.

The invention has been made in consideration of the above-described problem, and an object thereof is to provide a magnetoresistance effect device that functions as a high frequency device such as a high frequency filter by using a ferromagnetic resonance phenomenon.

To accomplish the above-described object, the present inventors have made a thorough investigation on a method of using the magnetoresistance effect device, which uses the ferromagnetic resonance phenomenon, as a high frequency device. As a result, they found a magnetoresistance effect device that uses a variation of a resistance value, which occurs due to the ferromagnetic resonance phenomenon, of the magnetoresistance effect element, and found that the magnetoresistance effect device functions as the high frequency device.

In addition, it is preferable to efficiently apply a large high frequency magnetic field to the magnetoresistance effect element and to enlarge a variation amount of the resistance value of the magnetoresistance effect element to improve output characteristics of the high frequency device. Accordingly, the present inventors found a configuration of the magnetoresistance effect device capable of efficiently applying a large high frequency magnetic field to the magnetoresistance effect element.

That is, the invention provides the following configurations to accomplish the above-described object.

(1) According to one aspect of the invention, there is provided a magnetoresistance effect device, including: a first port configured for a signal to be input; a second port configured for a signal to be output; a magnetoresistance effect element including a first ferromagnetic layer, a second ferromagnetic layer, and a spacer layer that is interposed between the first ferromagnetic layer and the second ferromagnetic layer; a first signal line which is connected to the first port, a high frequency current corresponding to the signal input from the first port flowing through the first signal line, and the first signal line being configured to apply a high frequency magnetic field to the magnetoresistance effect element; a second signal line that connects the second port and the magnetoresistance effect element to each other; and a direct current application terminal that is capable of being connected to a power supply that applies a direct current or a direct current voltage in a lamination direction of the magnetoresistance effect element, wherein the first signal line includes a magnetic field generator, which extends in a first direction, at a position in the lamination direction of the magnetoresistance effect element or an in-plane direction that is orthogonal to the lamination direction, and the magnetic field generator and the magnetoresistance effect element include an overlapping portion as viewed from the lamination direction in which the magnetic field generator is disposed, or the in-plane direction.

(2) In the magnetoresistance effect device according to the aspect, as viewed from the lamination direction in which the magnetic field generator is disposed or the in-plane direction, the magnetic field generator overlaps the entirety of a surface of the magnetoresistance effect element, or the magnetoresistance effect element overlaps the magnetic field generator along a second direction that is orthogonal to the first direction.

(3) In the magnetoresistance effect device according to the aspect, in a case where the magnetic field generator is provided in the lamination direction of the magnetoresistance effect element, a width of the magnetic field generator is 0.5 to 10 times a width of the magnetoresistance effect element.

(4) In the magnetoresistance effect device according to the aspect, the width of the magnetic field generator is 100 nm to 800 nm.

(5) In the magnetoresistance effect device according to the aspect, the thickness of the magnetic field generator is 50 nm to 500 nm.

(6) In the magnetoresistance effect device according to the aspect, in a case where the magnetic field generator is provided in the in-plane direction of the magnetoresistance effect element, the thickness of the magnetic field generator is 3 to 50 times the thickness of the magnetoresistance effect element.

(7) In the magnetoresistance effect device according to the aspect, a width of the magnetic field generator is 50 nm to 500 nm.

(8) In the magnetoresistance effect device according to the aspect, the thickness of the magnetic field generator is 100 nm to 800 nm.

(9) In the magnetoresistance effect device according to the aspect, a distance between the magnetic field generator and the magnetoresistance effect element is 500 nm or less.

(10) In the magnetoresistance effect device according to the aspect, an extension length of the magnetic field generator in the first direction is 20 µm or less.

(11) In the magnetoresistance effect device according to the aspect, an angle made by a direction of the high frequency magnetic field that is applied to the first ferromagnetic layer or the second ferromagnetic layer of the magnetoresistance effect element by the magnetic field generator, and an easy magnetization direction of the first ferromagnetic layer or the second ferromagnetic layer of the magnetoresistance effect element is 5° to 65°.

(12) In the magnetoresistance effect device according to the aspect, a plurality of the magnetoresistance effect elements are provided in series or in parallel with respect to the direct current application terminal.

(13) According to another aspect of the invention, there is provided a high frequency device that uses the magnetoresistance effect device according to the aspect.

According to the magnetoresistance effect device relating to the above-described aspect, it is possible to use the magnetoresistance effect device, which uses a ferromagnetic resonance phenomenon, as a high frequency device such as a high frequency filter and an amplifier.

In addition, according to the magnetoresistance effect device relating to the above-described aspect, it is possible to efficiently apply a large high frequency magnetic field to the magnetoresistance effect element.

DETAILED DESCRIPTION OF THE INVENTION

Figure 1:
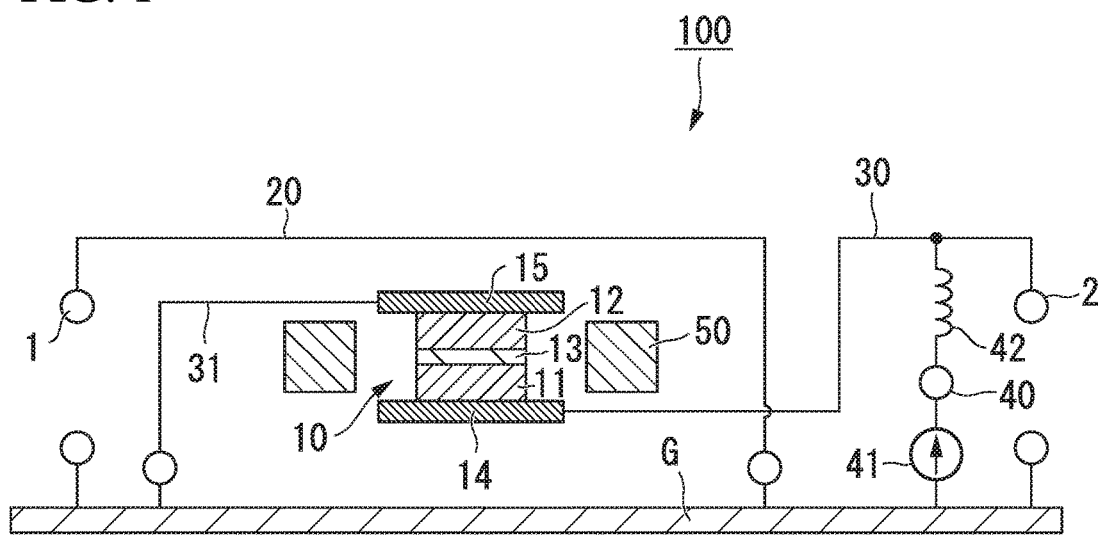
FIG. 1 is a schematic view of a magnetoresistance effect device according to a first embodiment.

Hereinafter, a magnetoresistance effect device will be described in detail with appropriate reference to the accompanying drawings. For convenience, in the drawings which are used in the following description, a characteristic portion may be illustrated in an enlarged manner for easy understanding of characteristics in some cases, and dimensional ratios of respective constituent elements may be different from actual dimensional ratios in some cases. Materials, dimensions, and the like, which are exemplified in the following description are illustrative only, and the invention is not limited thereto. The invention can be executed with appropriate modifications in a range in which the effect of the invention is exhibited.

First Embodiment

FIG. 1 is a schematic view illustrating a circuit configuration of a magnetoresistance effect device according to a first embodiment. A magnetoresistance effect device 100 illustrated in FIG. 1 includes a first port 1, a second port 2, a magnetoresistance effect element 10, a first signal line 20, a second signal line 30, a third signal line 31, a direct current application terminal 40, and a magnetic field applying mechanism 50.

First Port and Second Port

The first port 1 is an input terminal of the magnetoresistance effect device 100. The first port 1 corresponds to one end of the first signal line 20. When an AC signal source (not illustrated) is connected to the first port 1, an AC signal can be applied to the magnetoresistance effect device 100.

The second port 2 is an output terminal of the magnetoresistance effect device 100. The second port 2 corresponds to one end of the second signal line 30. When a high frequency measuring device (not illustrated) is connected to the second port 2, a signal output from the magnetoresistance effect device 100 can be measured. As the high frequency measuring device, for example, a network analyzer and the like can be used.

Magnetoresistance Effect Element

The magnetoresistance effect element 10 includes a first ferromagnetic layer 11, a second ferromagnetic layer 12, and a spacer layer 13 that is interposed between the first ferromagnetic layer 11 and the second ferromagnetic layer 12. In the following description, the first ferromagnetic layer is set as a magnetization fixed layer, and the second ferromagnetic layer is set as a magnetization free layer, but the first ferromagnetic layer and the second ferromagnetic layer may function as arbitrary layers. Magnetization of the magnetization fixed layer 11 is less likely to fluctuate in comparison to magnetization of the magnetization free layer 12, and is fixed to one direction under a predetermined magnetic field environment. When a magnetization direction of the magnetization free layer 12 relatively varies with respect to a magnetization direction of the magnetization fixed layer 11, a function of the magnetoresistance effect element 10 is exhibited.

The magnetization fixed layer 11 is constituted by a ferromagnetic material. It is preferable that the magnetization fixed layer 11 is constituted by high-spin-polarity materials such as Fe, Co, Ni, an alloy of Ni and Fe, an alloy of Fe and Co, and an alloy of Fe, Co, and B. When using these materials, a magnetoresistance variation rate of the magnetoresistance effect element 10 increases. In addition, the magnetization fixed layer 11 may be constituted by a Heusler alloy. The film thickness of the magnetization fixed layer 11 is preferably set to 1 to 10 nm.

A magnetization fixing method of the magnetization fixed layer 11 is not particularly limited. For example, an antiferromagnetic layer may be added to come into contact with the magnetization fixed layer 11 so as to fix the magnetization of the magnetization fixed layer 11. In addition, the magnetization of the magnetization fixed layer 11 may be fixed by using magnetic anisotropy that is caused by a crystal structure, a shape, and the like. In the antiferromagnetic layer, FeO, CoO, NiO, $CuFeS_2$, IrMn, FeMn, PtMn, Cr, Mn, and the like can be used.

The magnetization free layer 12 is constituted by a ferromagnetic material of which a magnetization direction is can be varied by an externally applied magnetic field, or spin-polarized electrons.

In the magnetization free layer 12, as a material having an axis of easy magnetization in an in-plane direction that is orthogonal to a lamination direction in which the magnetization free layer 12 is laminated, CoFe, CoFeB, CoFeSi, CoMnGe, CoMnSi, CoMnAl, and the like can be used. In addition, as a material having the axis of easy magnetization in the lamination direction of the magnetization free layer 12, Co, a CoCr-based alloy, a Co multi-layer film, a CoCrPt-based alloy, a FePt-based alloy, an SmCo-based alloy or a TbFeCo alloy which include rare-earth elements, and the like can be used. In addition, the magnetization free layer 12 may be constituted by the Heusler alloy.

The thickness of the magnetization free layer 12 is preferably set to approximately 1 to 10 nm. In addition, a high-spin-polarity material may be inserted between the magnetization free layer 12 and the spacer layer 13. When the high-spin-polarity material is inserted therebetween, it is possible to obtain a high magnetoresistance variation rate.

Examples of the high-spin-polarity material include a CoFe alloy, a CoFeB alloy, and the like. It is preferable that the film thickness of either the CoFe alloy or the CoFeB alloy is set to approximately 0.2 to 1.0 nm.

The spacer layer 13 is a nonmagnetic layer that is disposed between the magnetization fixed layer 11 and the magnetization free layer 12. The spacer layer 13 is constituted by a layer that is constituted by a conductor, an insulator, or a semiconductor, or a layer that includes an electric conduction site constituted by a conductor in an insulator.

For example, in a case where the spacer layer 13 is formed from an insulator, the magnetoresistance effect element 10 becomes a tunneling magnetoresistance (TMR) element, and in a case where the spacer layer 13 is formed from a metal, the magnetoresistance effect element 10 becomes a giant magnetoresistance (GMR) element.

In a case where the spacer layer 13 is constituted by a nonmagnetic conductive material, a conductive material such as Cu, Ag, Au, and Ru can be used. It is preferable that the film thickness of the spacer layer 13 is approximately 0.5 to 3.0 nm so as to efficiently use a GMR effect.

In a case where the spacer layer 13 is constituted by a nonmagnetic semiconductor material, a material such as ZnO, $In_2O_3$, $SnO_2$, ITO, $GaO_x$, and $Ga_2O_x$ can be used. In this case, it is preferable that the film thickness of the spacer layer 13 is approximately 1.0 to 4.0 nm.

In a case of applying a layer that includes an electric conduction site that is constituted by a conductor in a nonmagnetic insulator as the spacer layer 13, it is preferable to employ a structure in which an electric conduction site constituted by a conductor such as CoFe, CoFeB, CoFeSi, CoMnGe, CoMnSi, CoMnAl, Fe, Co, Au, Cu, Al, and Mg is included in the nonmagnetic insulator constituted by $Al_2O_3$ or MgO. In this case, it is preferable that the film thickness of the spacer layer 13 is approximately 0.5 to 2.0 nm.

It is preferable that an electrode is provided on both surface of the magnetoresistance effect element 10 in the lamination direction thereof so as to enhance electric conductivity with respect to the magnetoresistance effect element 10. Hereinafter, in the lamination direction, an electrode that is provided on a lower side of the magnetoresistance effect element 10 is referred to as a lower electrode 14, and an electrode that is provided on an upper side thereof is referred to as an upper electrode 15. When the lower electrode 14 and the upper electrode 15 are provided, contact between the second signal line 30 and the third signal line 31, and the magnetoresistance effect element 10 becomes surface contact, and thus in any position of the magnetoresistance effect element 10 in an in-plane direction, a signal (current) flows along the lamination direction.

The lower electrode 14 and the upper electrode 15 are constituted by a conductive material. For example, Ta, Cu, Au, AuCu, Ru, and the like can be used in the lower electrode 14 and the upper electrode 15.

In addition, a cap layer, a seed layer, or a buffer layer may be disposed between the magnetoresistance effect element 10 and the lower electrode 14 or the upper electrode 15. Examples of the cap layer, the seed layer, or the buffer layer include Ru, Ta, Cu, Cr, a laminated film thereof, and the like. It is preferable that the film thickness of these layers is set to approximately 2 to 10 nm.

With regard to a size of the magnetoresistance effect element 10, in a case where a shape of the magnetoresistance effect element 10 in a plan view is a rectangle (including a square), it is preferable that a long side is set to 300 nm or less. In a case where the shape of the magnetoresistance effect element 10 is not a rectangle in a plan view, a long side of a rectangle, which is circumscribed to the shape of the magnetoresistance effect element 10 in a plan view with a minimum area, is defined as the long side of the magnetoresistance effect element 10.

In a case where the long side is as small as approximately 300 nm, a volume of the magnetization free layer 12 decreases, and thus high-efficiency ferromagnetic resonance phenomenon is realized. Here, "shape in a plan view" is a shape as viewed from the lamination direction of respective layers which constitute the magnetoresistance effect element 10.

First Signal Line

One end of the first signal line 20 is connected to the first port 1, and the other end thereof is connected to a reference potential. In FIG. 1, the other end is connected to a ground G as the reference potential. A high frequency current flows through the first signal line 20 in correspondence with a potential difference between a high frequency signal that is input to the first port 1, and the ground G When a high frequency current flows through the first signal line 20, a high frequency magnetic field occurs from the first signal line 20. The high frequency magnetic field is applied to the magnetoresistance effect element 10.

Figure 2:
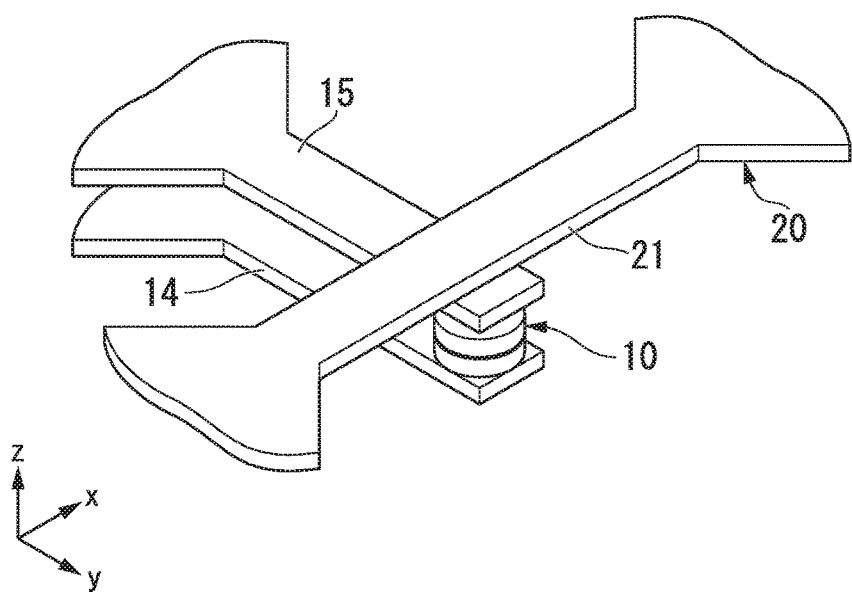
FIG. 2 is a perspective schematic view of the vicinity of a magnetoresistance effect element of the magnetoresistance effect device according to the first embodiment.

FIG. 2 is a perspective schematic view of the vicinity of the magnetoresistance effect element 10 of the magnetoresistance effect device 100 according to the first embodiment. Hereinafter, the lamination direction of the magnetoresistance effect element 10 is referred to as "z-direction", one direction in a plane that is orthogonal to the z-direction is referred to as "x-direction", and a direction that is orthogonal to the x-direction and the z-direction is referred to as "y-direction".

As illustrated in FIG. 2, the first signal line 20 includes a magnetic field generator 21, which extends in the x-direction (first direction) at a position of the magnetoresistance effect element 10 in the z-direction. Here, the magnetic field generator 21 represents a portion in which a high frequency magnetic field is generated when a high frequency current flows, and the entirety of the first signal line 20 may be the magnetic field generator.

FIGS. 3A to 3D are views illustrating the magnetoresistance effect device according to the first embodiment, and the vicinity of the magnetoresistance effect element 10 of the magnetoresistance effect device, in which the magnetic field generator and the magnetoresistance effect element do not overlap each other as viewed from the z-direction, in a plan view from the z-direction. As illustrated in FIGS. 3A to 3D, examples of an aspect in which the magnetoresistance effect element 10 and the magnetic field generator 21 overlap each other in a plan view from the z-direction include several cases.

Figure 3A:
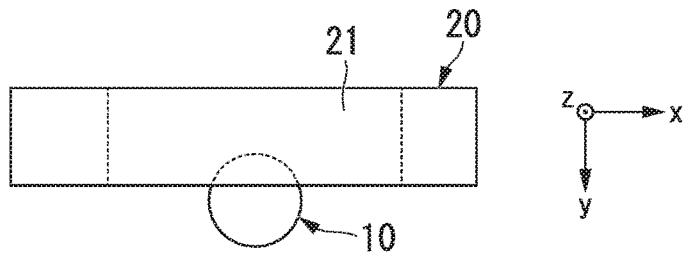
FIGS. 3A to 3D are views illustrating the magnetoresistance effect device according to the first embodiment, and the vicinity of the magnetoresistance effect element of the magnetoresistance effect device, in which the magnetic field generator and the magnetoresistance effect element do not overlap each other as viewed from a z-direction, in a plan view from the z-direction.
Figure 3B:
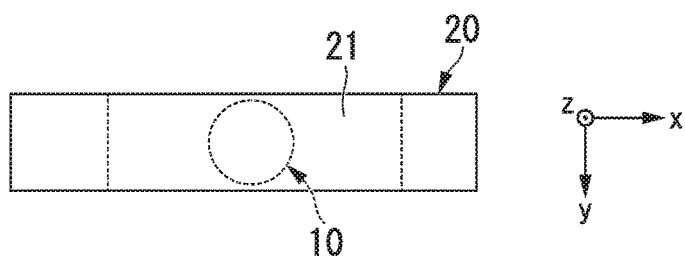
Figure 3C:
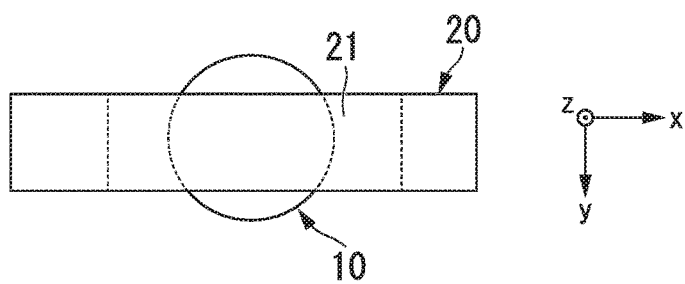
Figure 3D:
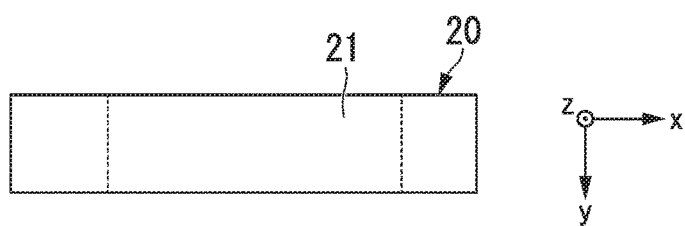
Figure 3D:
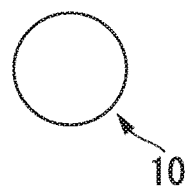

A first aspect is a case where a part of the magnetoresistance effect element 10 and a part of the magnetic field generator 21 overlap each other as illustrated in FIG. 3A. A second aspect is a case where the magnetic field generator 21 overlaps the entirety of a surface of the magnetoresistance effect element 10 as illustrated in FIG. 3B. In the second aspect, the magnetoresistance effect element 10 is included in a range of the magnetic field generator 21 in a plan view. A third aspect is a case where the magnetoresistance effect element 10 overlaps the magnetic field generator 21 along the y-direction as illustrated in FIG. 3C. In the third aspect, the magnetoresistance effect element 10 crosses the magnetic field generator 21 in the y-direction in a plan view. In addition, FIG. 3D schematically illustrates an aspect in which the magnetic field generator and the magnetoresistance effect element do not overlap each other as viewed from the z-direction.

Figure 4:
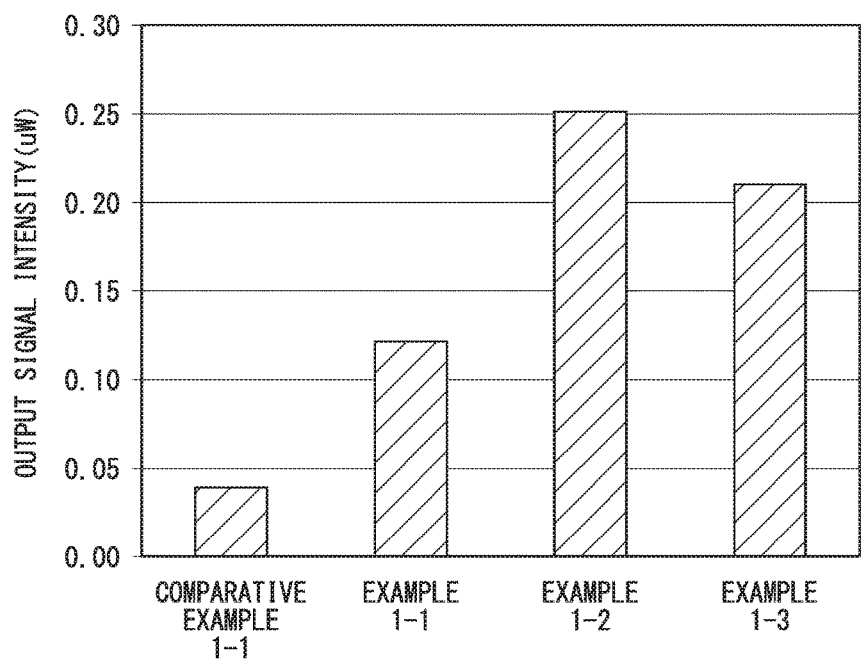
FIG. 4 illustrates results obtained by measuring output signal intensity of the magnetoresistance effect device when changing an overlapping state between the magnetic field generator and the magnetoresistance effect element as viewed from the z-direction.

FIG. 4 illustrates results obtained by measuring output signal intensity of the magnetoresistance effect device when changing an overlapping state between the magnetic field generator and the magnetoresistance effect element as viewed from the z-direction. Example 1-1 in FIG. 4 is a result of a case of the first aspect illustrated in FIG. 3A, Example 1-2 is a result of a case of the second aspect illustrated in FIG. 3B, Example 1-3 is a result of a case of the third aspect illustrated in FIG. 3C, and Comparative Example 1-1 is a result of a case of another aspect illustrated in FIG. 3D. Examination in FIG. 4 was performed through a simulation by using an electromagnetic field simulator under the following conditions.

In any case among Examples 1-1 to 1-3 and Comparative Example 1-1, a shape of the magnetoresistance effect element 10 in a plan view was set to a circle, and a diameter thereof was set to 200 nm. In addition, a width of the magnetic field generator 21 in the y-direction was set 200 nm. In Example 1-1, a distance between the central axis of the magnetic field generator 21 in the y-direction and the central axis of the magnetoresistance effect element 10 in the y-direction was set to 150 nm. In addition, in Examples 1-2 and 1-3, the central axis of the magnetic field generator 21 in the y-direction and the central axis of the magnetoresistance effect element 10 in the y-direction were set to match each other. In addition, in Comparative Example 1-1, a distance between the central axis of the magnetic field generator 21 in the y-direction and the central axis of the magnetoresistance effect element 10 in the y-direction was set to 200 nm. A frequency of a high frequency current allowed to flow through the magnetic field generator 21 was set to 3.6 GHz, and input power was set to −36 dBm. In addition, the magnetic field generator 21 was provided at a position located on an upward side by 100 nm in the z-direction from the magnetoresistance effect element 10.

As illustrated in FIG. 4, in Examples 1-1 to 1-3 in which the magnetic field generator 21 and the magnetoresistance effect element 10 have an overlapping portion as viewed from the z-direction in which the magnetic field generator 21 is disposed, output characteristics of the magnetoresistance effect device were more excellent in comparison to Comparative Examples 1-1 in which an overlapping portion was not provided. In addition, as in the second aspect (FIG. 3B, Example 1-2) and the third aspect (FIG. 3C, Example 1-3), when the central axis of the magnetoresistance effect element 10 in the y-direction and the central axis of the magnetic field generator 21 in the y-direction matched each other, signal intensity output from the magnetoresistance effect device 100 became stronger. In addition, as illustrated in the second aspect (FIG. 3B, Example 1-2), in a case where the magnetoresistance effect element 10 was included in the range of the magnetic field generator 21 in a plan view, the signal intensity output from the magnetoresistance effect device 100 became particularly stronger. It was confirmed that a relation between the overlapping state and the signal intensity output from the magnetoresistance effect device showed the same tendency even when varying a width of the magnetic field generator, a diameter of the magnetoresistance effect element, and the like.

The reason why signal intensity output from the magnetoresistance effect device increases when an overlapping portion between the magnetic field generator 21 and the magnetoresistance effect element 10 exists is not clear. However, a signal output from the magnetoresistance effect device depends on the variation amount of the resistance value of the magnetoresistance effect element 10. Accordingly, it is considered that a high frequency magnetic field with appropriate intensity is applied to the magnetization free layer 12 of the magnetoresistance effect element 10 from an appropriate direction, and thus the variation amount of the resistance value of the magnetoresistance effect element 10 increases.

A relation between the magnetic field generator 21 and the magnetoresistance effect element 10 has an effect on output characteristics of the magnetoresistance effect device. In the magnetoresistance effect device according to the first embodiment, it is preferable that a width of the magnetic field generator 21 is 0.5 to 10 times a width of the magnetoresistance effect element 10, more preferably 0.75 to 4 times, and still more preferably 1.0 times.

Here, the "width" represents a width in a direction (y-direction) orthogonal to a current (x-direction) that flows through the magnetic field generator 21 in an xy-plane orthogonal to the z-direction in which the magnetoresistance effect element 10 is laminated. For example, the width of the magnetoresistance effect element 10 represents a length of a perpendicular line that is drawn from one end of the magnetoresistance effect element 10 in the y-direction to the other end in the y-direction toward a straight line parallel to the x-direction.

Figure 5:
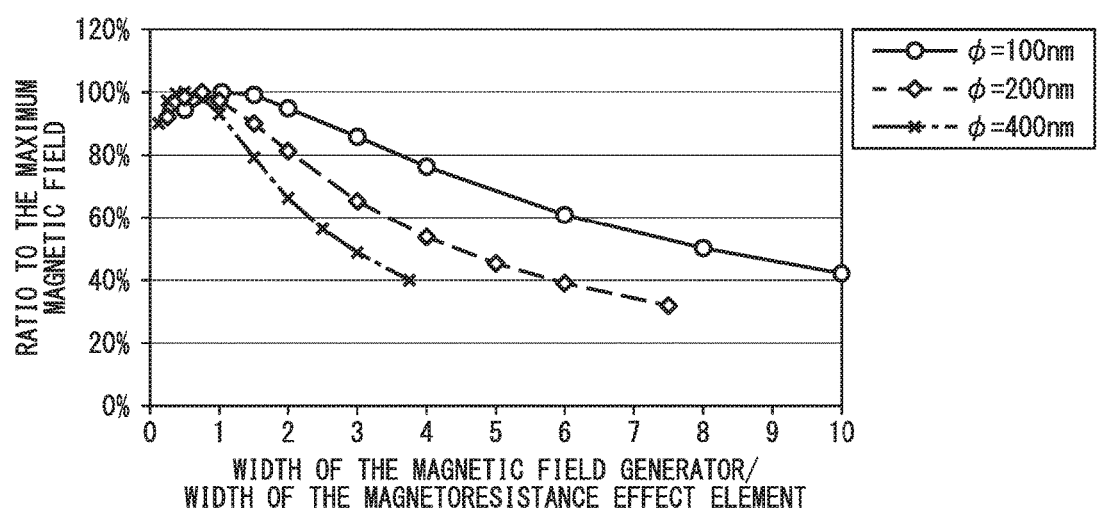
FIG. 5 is a view illustrating an intensity relation of a high frequency magnetic field when varying a relative relation between a width of the magnetoresistance effect element and a width of the magnetic field generator in the magnetoresistance effect device according to the first embodiment.

FIG. 5 is a view illustrating an intensity relation of a high frequency magnetic field when varying a relative relation between the width of the magnetoresistance effect element 10 and the width of the magnetic field generator 21. Examination in FIG. 5 was performed through a simulation by using an electromagnetic field simulator under the following conditions.

The magnetic field generator 21 was provided at a position located on an upward side by 100 nm in the z-direction from the magnetoresistance effect element 10. The center of the magnetoresistance effect element 10 was provided on the central line of the magnetic field generator 21 in the y-direction. A length of the magnetic field generator 21 was set to 3 μm, and the thickness thereof in the z-direction was set to 100 nm. A frequency of a high frequency current allowed to flow through the magnetic field generator 21 was set to 3.6 GHz, and input power was set to −36 dBm.

In three cases in which a shape of the magnetoresistance effect element 10 in a plan view was set to a circle, and a diameter thereof was set to 100 nmϕ, 200 nmϕ, and 400 nmϕ, a condition in which a component in an xy-plane of the high frequency magnetic field applied to the magnetoresistance effect element 10 when changing the width of the magnetic field generator 21 in the y-direction reached the maximum value was obtained.

As illustrated in FIG. 5, a magnetic field applied to the magnetoresistance effect element 10 showed the maximum value in the vicinity of a site at which the width of the magnetic field generator 21 is one times the width of the magnetoresistance effect element 10. The same tendency was confirmed even when changing the diameter of the magnetoresistance effect element 10 in a plan view.

It is preferable that the width of the magnetic field generator 21 is 100 nm to 800 nm, more preferably 125 nm to 400 nm, and still more preferably 150 nm to 200 nm.

Figure 6:
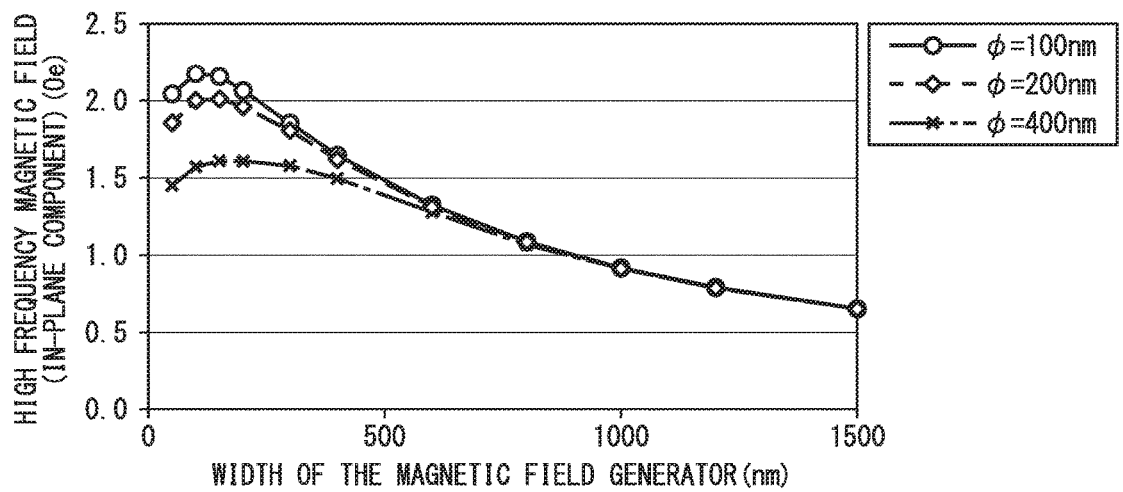
FIG. 6 is a view illustrating an intensity relation of the high frequency magnetic field that is applied to the magnetoresistance effect element when varying the width of the magnetic field generator in the magnetoresistance effect device according to the first embodiment.

FIG. 6 is a view illustrating an intensity relation of a high frequency magnetic field that is applied to the magnetoresistance effect element when varying the width of the magnetic field generator 21. Examination in FIG. 6 was performed through a simulation by using an electromagnetic field simulator under the same conditions as in examination in FIG. 5.

As illustrated in FIG. 6, a component in an xy-plane direction of the magnetoresistance effect element 10 showed the maximum value when the width of the magnetic field generator 21 was a predetermined value. As illustrated in the relation between the width of the magnetoresistance effect element 10 and the width of the magnetic field generator 21, the width of the magnetic field generator 21 at which the maximum value was showed was approximately the same as the width of the magnetoresistance effect element 10.

It is preferable that the thickness of the magnetic field generator 21 in the z-direction is 50 nm to 500 nm, more preferably 75 nm to 200 nm, and still more preferably 100 nm to 150 nm.

Figure 7:
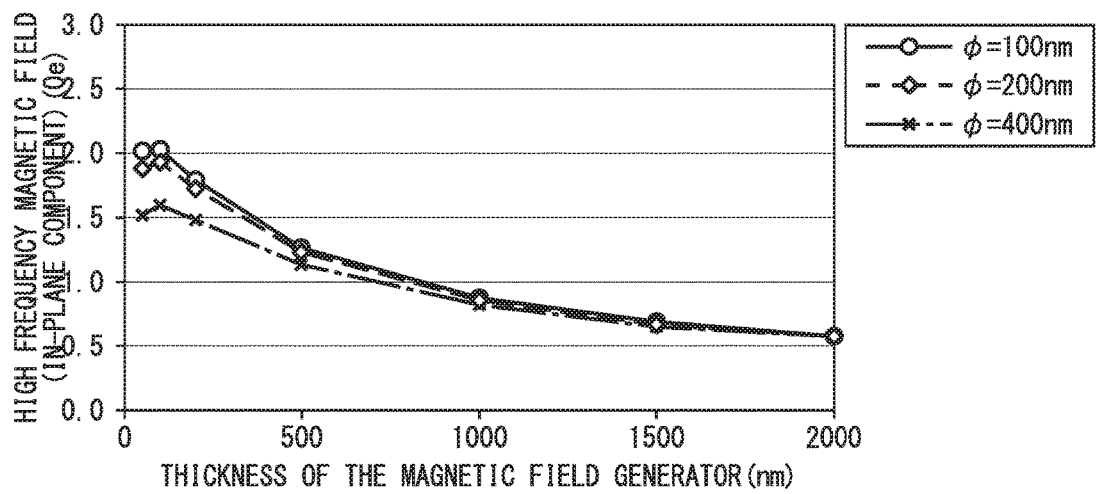
FIG. 7 is a view illustrating an intensity relation of the high frequency magnetic field that is applied to the magnetoresistance effect element when varying the thickness of the magnetic field generator in the magnetoresistance effect device according to the first embodiment.

FIG. 7 is a view illustrating an intensity relation of the high frequency magnetic field that is applied to the magnetoresistance effect element when varying the thickness of the magnetic field generator 21. Examination in FIG. 7 was performed through simulation by using an electromagnetic field simulator under the same conditions as in the examination in FIG. 5 except that the width of the magnetic field generator 21 was fixed to 200 nm, and the thickness of the magnetic field generator 21 was changed.

As illustrated in FIG. 7, with regard to the component in the xy-plane direction of the magnetoresistance effect element 10, the intensity of the high frequency magnetic field showed the maximum value when the thickness of the magnetic field generator 21 was approximately 100 nm. The thickness of the magnetic field generator 21 at which the maximum value was shown was constant regardless of the size of the magnetoresistance effect element 10.

In addition, it is preferable that a distance between the magnetic field generator 21 and the magnetoresistance effect element 10 is 500 nm or less, more preferably 200 nm or less, and still more preferably 100 nm or less.

Figure 8:
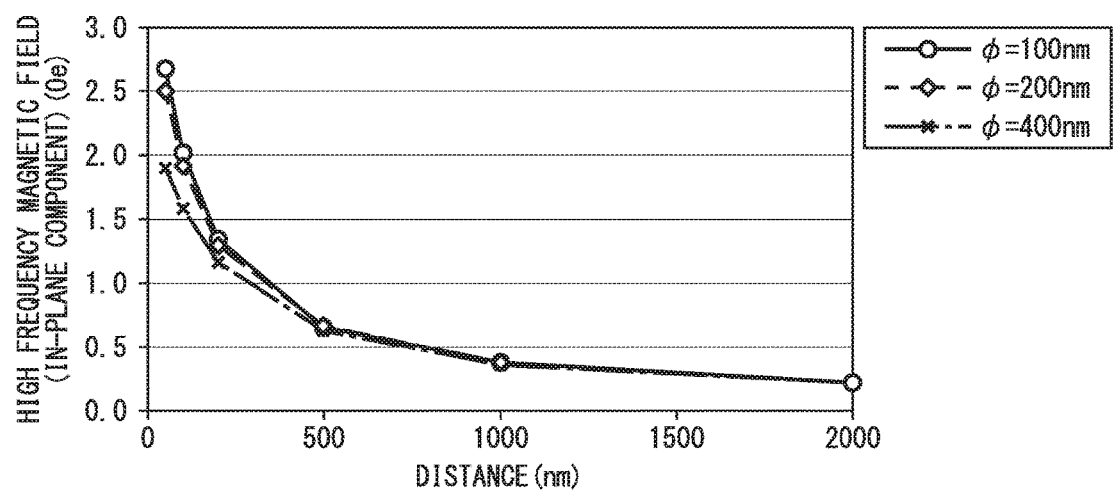
FIG. 8 is a view illustrating an intensity relation of the high frequency magnetic field that is applied to the magnetoresistance effect element when varying a distance between the magnetic field generator and the magnetoresistance effect element in the magnetoresistance effect device according to the first embodiment.

FIG. 8 is a view illustrating an intensity relation of the high frequency magnetic field that is applied to the magnetoresistance effect element when varying a distance between the magnetic field generator 21 and the magnetoresistance effect element 10. Examination in FIG. 8 was performed through simulation by using an electromagnetic field simulator under the same conditions as in the examination in FIG. 5 except that the width of the magnetic field generator 21 was fixed to 200 nm, and a distance between the magnetic field generator 21 and the magnetoresistance effect element 10 was changed.

As illustrated in FIG. 8, as the distance between the magnetic field generator 21 and the magnetoresistance effect element 10 was shorter, it was possible to apply a greater magnetic field to the magnetoresistance effect element 10.

In addition, it is preferable that an extension length of the magnetic field generator 21 in the x-direction is 20 μm or less, more preferably 10 μm or less, and still more preferably 5 μm or less.

Figure 9:
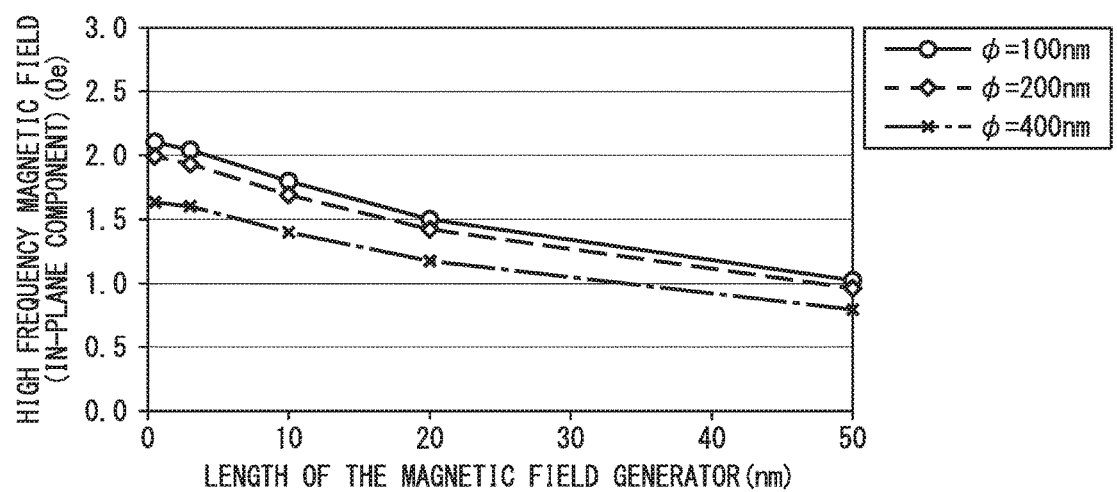
FIG. 9 is a view illustrating an intensity relation of the high frequency magnetic field that is applied to the magnetoresistance effect element when varying a length of the magnetic field generator in the magnetoresistance effect device according to the first embodiment.

FIG. 9 is a view illustrating an intensity relation of the high frequency magnetic field that is applied to the magnetoresistance effect element when varying a length of the magnetic field generator 21 in the x-direction. Examination in FIG. 9 was performed through simulation by using an electromagnetic field simulator under the same conditions as in the examination in FIG. 5 except that the width of the magnetic field generator 21 was fixed to 200 nm, and the length of the magnetic field generator 21 in the x-direction was changed.

As illustrated in FIG. 9, as the length of the magnetic field generator 21 in the x-direction increases, the magnitude of a magnetic field applied to the magnetoresistance effect element 10 decreases.

Figure 10:
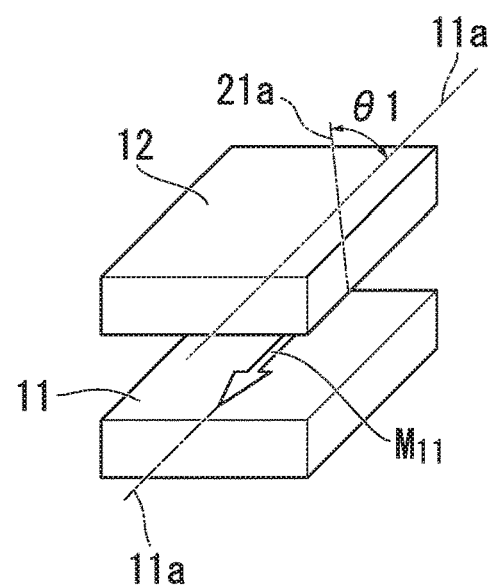
FIG. 10 is a view illustrating a relation between a direction of the high frequency magnetic field that is applied to a magnetization free layer of the magnetoresistance effect element and an easy magnetization direction of a magnetization fixed layer.

In addition, it is preferable that an arrangement direction of the magnetic field generator 21 is determined in consideration of a direction of the high frequency magnetic field that is applied to the magnetoresistance effect element 10 and an easy magnetization direction of the magnetization fixed layer 11. FIG. 10 is a view illustrating a relation between the direction of the high frequency magnetic field that is applied to the magnetization free layer 12 of the magnetoresistance effect element 10 and the easy magnetization direction of the magnetization fixed layer 11. In FIG. 10, for easy understanding, only the magnetization fixed layer 11 and the magnetization free layer 12 of the magnetoresistance effect element 10 are illustrated.

Magnetization $M_{11}$ of the magnetization fixed layer 11 is fixed to an easy magnetization direction 11a. On the other hand, a high frequency magnetic field is applied to the magnetization free layer 12 from the magnetic field generator 21 (refer to FIG. 2). The magnetic field generator 21 generates a magnetic field in a rotary direction in which a direction in which the magnetic field generator 21 extends is set as an axis according to Ampere's law. In FIG. 2, since the magnetic field generator 21 extends in the x-direction, a direction of the high frequency magnetic field applied to the magnetization free layer 12 of the magnetoresistance effect element 10 becomes the y-direction. In FIG. 10, a direction in which the high frequency magnetic field is applied to the magnetization free layer 12 is indicated by a reference numeral 21a.

It is preferable that an angle $\theta 1$, which is made by the direction 21a of the high frequency magnetic field that is applied to the magnetization free layer 12 of the magnetoresistance effect element 10 by the magnetic field generator 21 and the easy magnetization direction 11a of the magnetization fixed layer 11 of the magnetoresistance effect element 10, is 5° to 65°, and more preferably 20° to 55°.

Figure 11:
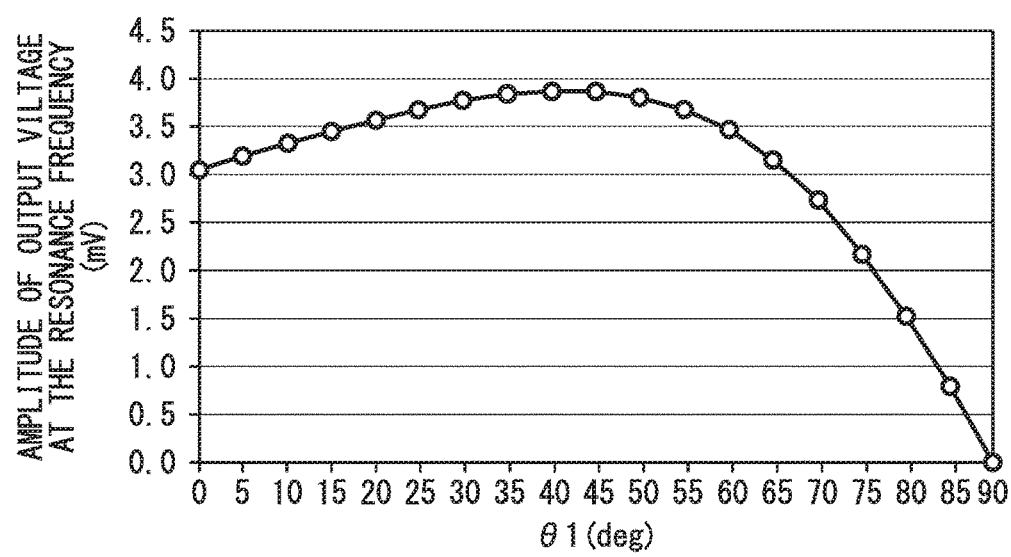
FIG. 11 is a view illustrating a variation of an amplitude of an output voltage that is output from the magnetoresistance effect device when changing an angle made by a direction of the high frequency magnetic field that is applied to the magnetization free layer and the easy magnetization direction of the magnetization fixed layer.

FIG. 11 is a view illustrating a variation of an amplitude of an output voltage that is output from the magnetoresistance effect device 100 when changing the angle $\theta 1$ that is made by the direction 21a of the high frequency magnetic field that is applied to the magnetization free layer 12 and the easy magnetization direction 11a of the magnetization fixed layer 11. As illustrated in FIG. 11, when the angle $\theta 1$ that is made by the direction 21a of the high frequency magnetic field that is applied to the magnetization free layer 12 and the easy magnetization direction 11a of the magnetization fixed layer 11 is within the above-described range, the amplitude of the output voltage increases.

Second Signal Line, Third Signal Line

One end of the second signal line 30 is connected to the magnetoresistance effect element 10, and the other end thereof is connected to the second port 2. That is, the second signal line 30 connects the magnetoresistance effect element 10 and the second port 2 to each other. The second signal line 30 outputs a signal of a frequency selected by using ferromagnetic resonance of the magnetoresistance effect element 10 from the second port 2.

One end of the third signal line 31 is connected to the magnetoresistance effect element 10, and the other end thereof is connected to a reference potential. In FIG. 1, the third signal line 31 is connected to the ground G that is common to the reference potential of the first signal line 20, but it may be connected to another reference potential. For simplification of a circuit configuration, it is preferable that the reference potential of the first signal line 20 and the reference potential of the third signal line 31 are common to each other.

It is preferable that the shape of the respective signal lines and the ground G is defined as a micro strip line (MSL) type or a coplanar waveguide (CPW) type. In design of the micro strip line (MSL) type or the coplanar waveguide (CPW) type, it is preferable to design a signal line width or an inter-ground distance so that characteristic impedance of the signal line and circuit system impedance become the same as each other. Through the above-described design, it is possible to suppress a transmission loss of the signal lines.

Direct Current Application Terminal

A direct current application terminal 40 is connected to the power supply 41, and applies a direct current or a direct current voltage in the lamination direction of the magnetoresistance effect element 10. The power supply 41 may be constituted by a combination circuit of fixed resistance and a direct current voltage source as long as a constant direct current can be generated. In addition, the power supply 41 may be a direct current source or a direct current voltage source.

An inductor 42 is disposed between the direct current application terminal 40 and the second signal line 30. The inductor 42 cuts a high frequency component out of a current, and allows only a direct current component of the current to pass therethrough. An output signal output from the magnetoresistance effect element 10 by the inductor 42 efficiently flows to the second port 2. In addition, a direct current current flows through a closed circuit including the power supply 41, the second signal line 30, the magnetoresistance effect element 10, the third signal line 31, and the ground G by the inductor 42.

As the inductor 42, a chip inductor, an inductor by a pattern line, a resistor element including an inductor component, and the like can be used. It is preferable that inductance of the inductor 42 is 10 nH or greater.

Magnetic Field Applying Mechanism

The magnetic field applying mechanism 50 applies an external magnetic field to the magnetoresistance effect element 10, and modulates a resonance frequency of the magnetoresistance effect element 10. A signal output from the magnetoresistance effect device 100 fluctuates due to the resonance frequency of the magnetoresistance effect element 10. According to this, it is preferable to further include the magnetic field applying mechanism to make an output signal variable.

It is preferable that the magnetic field applying mechanism 50 is disposed in the vicinity of the magnetoresistance effect element 10. For example, the magnetic field applying mechanism 50 is constituted as an electromagnet type or a strip line type which is capable of variably controlling applied magnetic field intensity by either a voltage or a current. In addition, the magnetic field applying mechanism 50 can be constituted by a combination of the electromagnet type or the strip line type which is capable of variably controlling the applied magnetic field intensity, and a permanent magnet that supplies only a constant magnetic field.

Function of Magnetoresistance Effect Device

When a high frequency signal is input to the magnetoresistance effect device 100 from the first port 1, a high frequency current corresponding to the high frequency signal flows through the first signal line 20. The high frequency current, which flows through the first signal line 20, applies a high frequency magnetic field to the magnetoresistance effect element 10. The first signal line 20 is provided at a predetermined position with respect to the magnetoresistance effect element 10, and applies a large high-frequency magnetic field to the magnetoresistance effect element 10.

Magnetization of the magnetization free layer 12 of the magnetoresistance effect element 10 greatly oscillates in a case where the high frequency magnetic field applied to the magnetoresistance effect element 10 by the first signal line 20 is in the vicinity of the ferromagnetic resonance frequency of the magnetization free layer 12. This phenomenon is a ferromagnetic resonance phenomenon.

When oscillation of the magnetization free layer 12 increases, a variation of the resistance value in the magnetoresistance effect element 10 increases. The variation of the resistance value of the magnetoresistance effect element 10 is output from the second port 2 as a potential difference between the lower electrode 14 and the upper electrode 15.

That is, in a case where the high frequency signal input from the first port 1 is in the vicinity of the resonance frequency of the magnetization free layer 12, a variation amount of a resistance value of the magnetoresistance effect element 10 increases, and thus a large signal is output from the second port 2. In contrast, in a case where the high frequency signal deviates from the resonance frequency of the magnetization free layer 12, the variation amount of the resistance value of the magnetoresistance effect element 10 is small, and thus a signal is rarely output from the second port 2. That is, the magnetoresistance effect device 100 functions as a high frequency filter capable of selectively allowing only a high frequency signal of a specific frequency to pass therethrough.

A frequency that is selected by the magnetoresistance effect device 100 can be modulated by changing the ferromagnetic resonance frequency of the magnetization free layer 12. The ferromagnetic resonance frequency varies in accordance with an effective magnetic field in the magnetization free layer 12. When an external magnetic field applied to the magnetization free layer 12 is set as $H_E$, an anisotropic magnetic field in the magnetization free layer 12 is set as $H_k$, a demagnetizing field in the magnetization free layer 12 is set as $H_D$, and an exchange coupling magnetic field in the magnetization free layer 12 is set as $H_{EX}$, the effective magnetic field $H_{eff}$ in the magnetization free layer 12 is expressed by the following expression.

$$H_{eff} = H_E + H_k + H_D + H_{EX}$$

Figure 12:
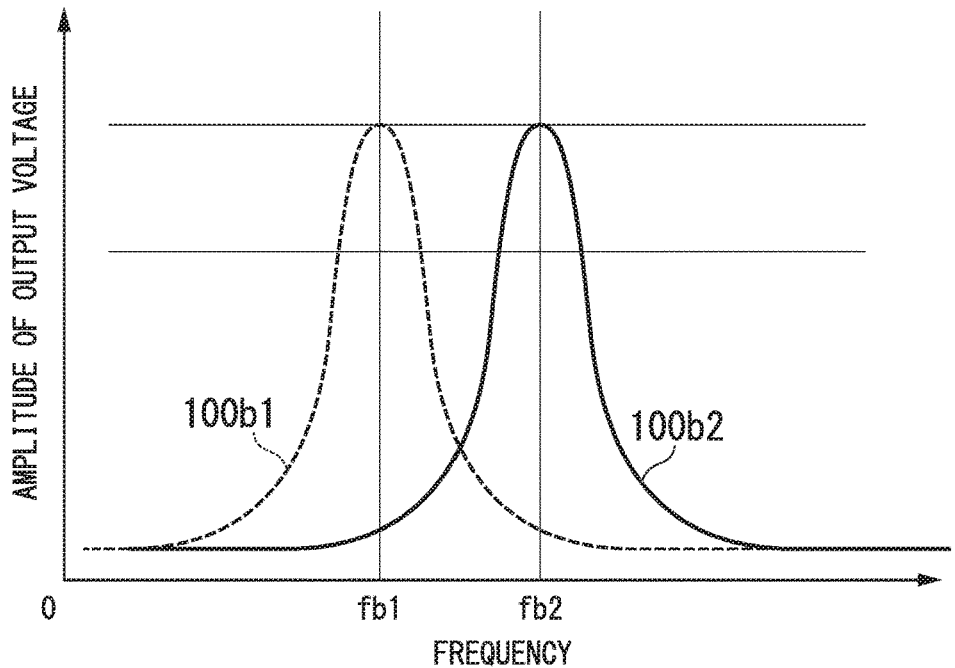
FIG. 12 is a view illustrating a relation between a frequency of a high frequency signal that is input to the magnetoresistance effect device and an amplitude of a voltage that is output in a case where a direct current applied to the magnetoresistance effect element is constant.

As expressed by the above-described expression, the effective magnetic field in the magnetization free layer 12 is affected by the external magnetic field $H_E$. The magnitude of the external magnetic field $H_E$ can be adjusted by the magnetic field applying mechanism 50. FIG. 12 is a view illustrating a relation between a frequency of a high frequency signal that is input to the magnetoresistance effect device 100 and an amplitude of a voltage that is output in a case where a direct current applied to the magnetoresistance effect element 10 is constant.

When an arbitrary external magnetic field is applied to the magnetoresistance effect element 10, the ferromagnetic resonance frequency of the magnetization free layer 12 is influenced by the external magnetic field and varies. The ferromagnetic resonance frequency at this time is set as fb1. The ferromagnetic resonance frequency of the magnetization free layer 12 is fb1, and thus the amplitude of the output voltage increases when the frequency of the high frequency signal input to the magnetoresistance effect device 100 is fb1. According to this, a graph of a plot line 100b1 illustrated in FIG. 12 is obtained.

When the external magnetic field that is subsequently applied is enlarged, the ferromagnetic resonance frequency is influenced by the external magnetic field, and shifts from fb1 to fb2. At this time, a frequency at which the amplitude of the output voltage increases also shifts from fb1 to fb2. As a result, a graph of a plot line 100b2 illustrated in FIG. 12 is obtained. As described above, the magnetic field applying mechanism 50 can modulate the ferromagnetic resonance frequency by adjusting the effective magnetic field $H_{eff}$ applied to the magnetization free layer 12 of the magnetoresistance effect element 10.

Figure 13:
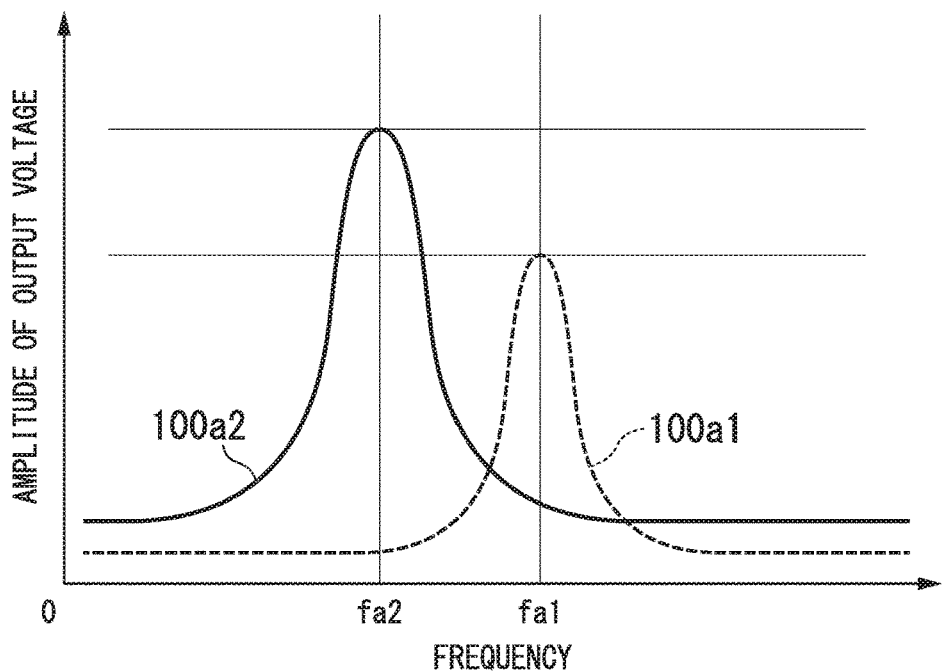
FIG. 13 is a view illustrating a relation between the frequency of the high frequency signal that is input to the magnetoresistance effect device and the amplitude of the voltage that is output in a case where an external magnetic field applied to the magnetoresistance effect element is constant.

In addition, it is also possible to modulate the ferromagnetic resonance frequency by changing a current density of a direct current applied to the magnetoresistance effect element 10 from the power supply 41. FIG. 13 is a view illustrating a relation between the frequency of the high frequency signal that is input to the magnetoresistance effect device 100 and the amplitude of the voltage that is output in a case where an external magnetic field applied to the magnetoresistance effect element 10 is constant.

An output voltage, which is output from the second port 2 of the magnetoresistance effect device 100, is expressed by the product of a resistance value that oscillates in the magnetoresistance effect element 10 and a direct current that flows to the magnetoresistance effect element 10. When the direct current that flows to the magnetoresistance effect element increases, the amplitude (output signal) of the output voltage increases.

In addition, when the amount of the direct current that flows to the magnetoresistance effect element 10 varies, a magnetization state in the magnetization free layer 12 varies, and the magnitude of the anisotropic magnetic field $H_k$, the demagnetizing field $H_D$, and the exchange coupling magnetic field $H_{EX}$ in the magnetization free layer 12 varies. As a result, when a direct current is enlarged, the ferromagnetic resonance frequency is lowered. That is, as illustrated in FIG. 13, when the amount of the direct current increases, shift from a plot line 100a1 to a plot line 100a2 occurs. As described above, it is possible to modulate the ferromagnetic resonance frequency by changing the amount of the current applied to the magnetoresistance effect element 10 from the power supply 41.

In addition, description has been given with reference to a case where the magnetoresistance effect device is used as a high frequency filter as an example, but the magnetoresistance effect device can be used as a high frequency device such as isolator, a phase shifter, and an amplifier.

In a case of using the magnetoresistance effect device as the isolator, a signal is input from the second port 2. Even when the signal is input from the second port 2, the signal is not output from the first port 1, and thus the magnetoresistance effect device functions as the isolator.

In addition, in a case of using the magnetoresistance effect device as the phase shifter, when an output frequency band varies, attention is focused on a frequency at an arbitrary one point of the output frequency band. When the output frequency band varies, since a phase at a specific frequency varies, the magnetoresistance effect device functions as the phase shifter.

In addition, in a case of using the magnetoresistance effect device as an amplifier, the variation amount of the resistance value of the magnetoresistance effect element 10 is increased. The variation amount of the resistance value of the magnetoresistance effect element 10 increases when setting a direct current input from the power supply 41 to a predetermined magnitude or greater, or when enlarging the high frequency magnetic field applied to the magnetoresistance effect element 10 by the first signal line 20. When the variation amount of the resistance value of the magnetoresistance effect element 10 increases, a signal output from the second port 2 is further enlarged in comparison to the signal that is input from the first port 1, and thus the magnetoresistance effect device functions as the amplifier.

As described above, the magnetoresistance effect device 100 according to the first embodiment can function as the high frequency device such as the high frequency filter, the isolator, the phase shifter, and the amplifier.

In addition, in the magnetoresistance effect device 100 according to the first embodiment, the first signal line 20 is provided at a predetermined position with respect to the magnetoresistance effect element 10, and the first signal line 20 can apply a large high-frequency magnetic field to the magnetoresistance effect element 10. As a result, the variation amount of the resistance value of the magnetoresistance effect element 10 increases, and thus the magnetoresistance effect device 100 having excellent output characteristics is obtained.

Second Embodiment

Figure 14:
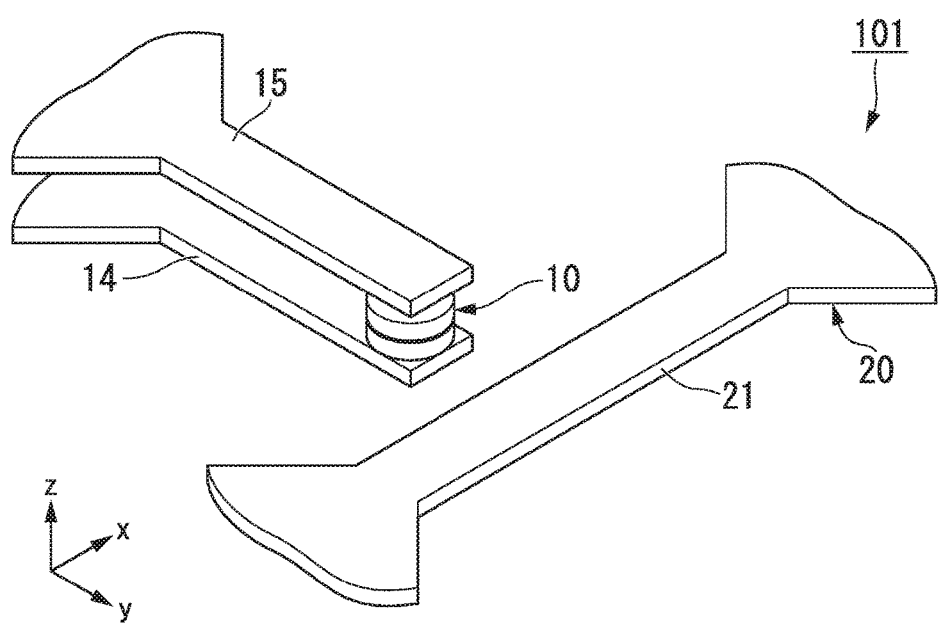
FIG. 14 is a perspective schematic view of the vicinity of a magnetoresistance effect element of a magnetoresistance effect device according to a second embodiment.

FIG. 14 is a perspective schematic view of the vicinity of a magnetoresistance effect element 10 of a magnetoresistance effect device 101 according to a second embodiment. The magnetoresistance effect device 101 according to the second embodiment is different from the magnetoresistance effect device 100 according to the first embodiment in that the magnetic field generator 21 is disposed in an in-plane direction of the magnetoresistance effect element 10. The other configurations are the same as in the magnetoresistance effect device 100, and the same reference numeral will be given to the same configurations.

FIGS. 15A to 15D are views illustrating the magnetoresistance effect device according to the second embodiment, and the vicinity of the magnetoresistance effect element 10, in which the magnetic field generator and the magnetoresistance effect element do not overlap each other as viewed from a y-direction, in a plan view from the y-direction. As illustrated in FIGS. 15A to 15D, in a plan view from the y-direction, examples of an aspect in which the magnetoresistance effect element 10 and the magnetic field generator 21 overlap each other include several cases.

Figure 15A:
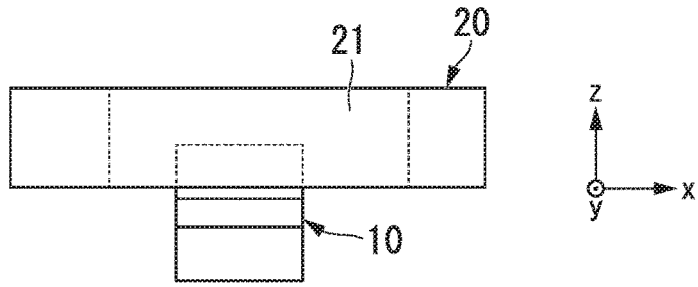
FIGS. 15A to 15D are views illustrating the magnetoresistance effect device according to the second embodiment, and the vicinity of the magnetoresistance effect element of the magnetoresistance effect device, in which the magnetic field generator and the magnetoresistance effect element do not overlap each other as viewed from a y-direction, in a plan view from the y-direction.
Figure 15B:
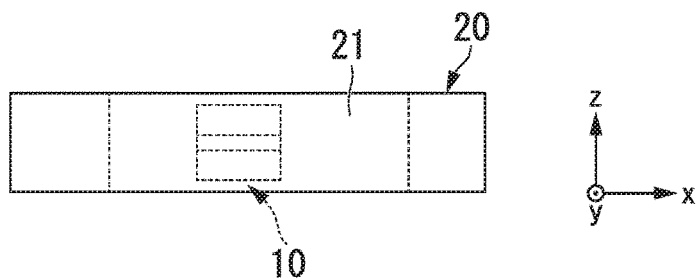
Figure 15C:
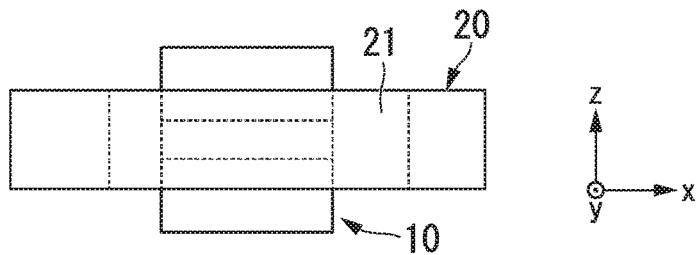
Figure 15D:
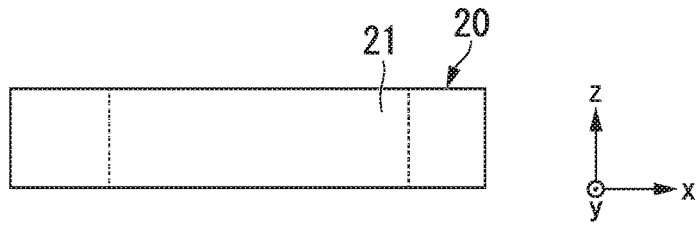
Figure 15D:
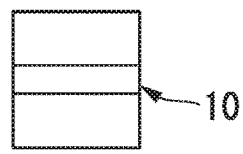

A first aspect is a case where a part of the magnetoresistance effect element 10 and a part of the magnetic field generator 21 overlap each other as illustrated in FIG. 15A. A second aspect is a case where the magnetic field generator 21 overlaps the entirety of a surface of the magnetoresistance effect element 10 as illustrated in FIG. 15B. In the second aspect, the magnetoresistance effect element 10 is included in a range of the magnetic field generator 21 in a plan view. A third aspect is a case where the magnetoresistance effect element 10 overlaps the magnetic field generator 21 along the z-direction as illustrated in FIG. 15C. In the third aspect, the magnetoresistance effect element 10 crosses the magnetic field generator 21 in the z-direction in a plan view. In addition, FIG. 15D schematically illustrates an aspect in which the magnetic field generator and the magnetoresistance effect element do not overlap each other as viewed from the y-direction.

Figure 16:
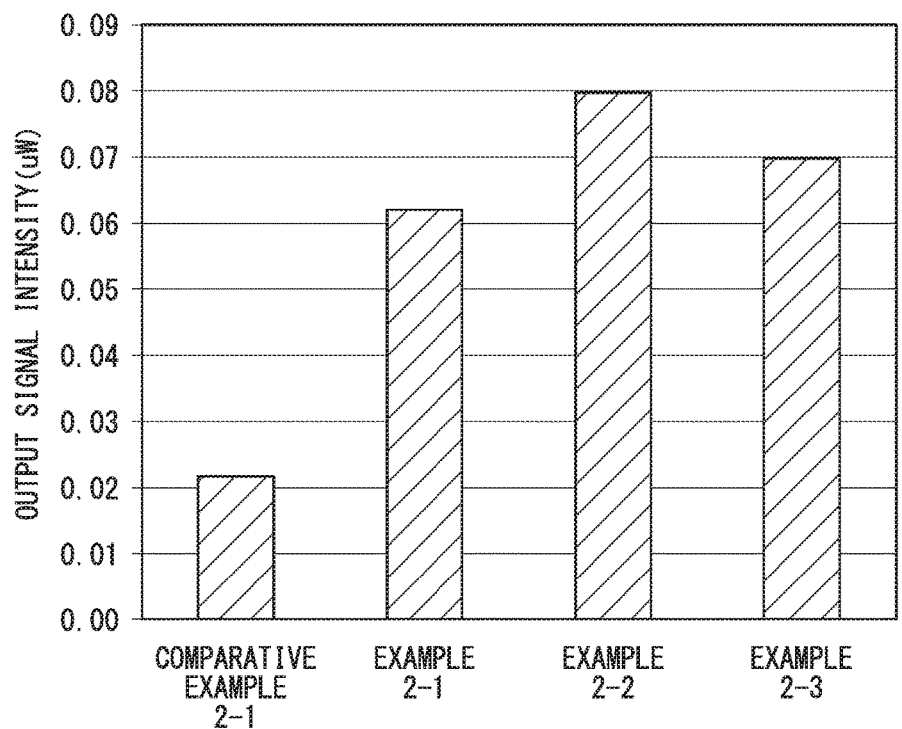
FIG. 16 illustrates results obtained by measuring output signal intensity of the magnetoresistance effect device when changing an overlapping state between the magnetic field generator and the magnetoresistance effect element as viewed from the y-direction.

FIG. 16 illustrates results obtained by measuring output signal intensity of the magnetoresistance effect device when changing an overlapping state between the magnetic field generator and the magnetoresistance effect element as viewed from the y-direction. Example 2-1 in FIG. 16 is a result of a case of the first aspect illustrated in FIG. 15A, Example 2-2 is a result of a case of the second aspect illustrated in FIG. 15B, Example 2-3 is a result of a case of the third aspect illustrated in FIG. 15C, and Comparative Example 2-1 is a result of a case of another aspect illustrated in FIG. 15D. Examination in FIG. 16 was performed through a simulation by using an electromagnetic field simulator under the following conditions.

In any case among Examples 2-1 to 2-3, and Comparative Example 2-1, a shape of the magnetoresistance effect element 10 in a plan view was set to a circle, a diameter thereof is set to 200 nm, and a height thereof was set to 20 nm. In addition, the thickness of the magnetic field generator 21 in the z-direction was set to 100 nm. In example 2-1, a distance between the central axis of the magnetic field generator 21 in the z-direction and the central axis of the magnetoresistance effect element 10 in the z-direction was set to 55 nm. In addition, in Examples 2-2 and 2-3, the central axis of the magnetic field generator 21 in the z-direction and the central axis of the magnetoresistance effect element 10 in the z-direction were set to match each other. In addition, in Comparative Example 2-1, a distance between the central axis of the magnetic field generator 21 in the z-direction and the central axis of the magnetoresistance effect element 10 in the z-direction was set to 200 nm. A frequency of a high frequency current allowed to flow through the magnetic field generator 21 was set to 3.6 GHz, and input power was set to −36 dBm. In addition, the magnetic field generator 21 was provided at a position located on a lateral side by 100 nm in the y-direction from the magnetoresistance effect element 10.

As illustrated in FIG. 16, in Examples 2-1 to 2-3 in which the magnetic field generator 21 and the magnetoresistance effect element 10 have an overlapping portion as viewed from the y-direction in which the magnetic field generator 21 is disposed, output characteristics of the magnetoresistance effect device were more excellent in comparison to Comparative Examples 2-1 in which an overlapping portion was not provided. In addition, as in the second aspect (FIG. 15B, Example 2-2) and the third aspect (FIG. 15C, Example 2-3), when the central axis of the magnetoresistance effect element 10 in the z-direction and the central axis of the magnetic field generator 21 in the z-direction matched each other, signal intensity output from the magnetoresistance effect device 100 became more stronger. In addition, as illustrated in the second aspect (FIG. 15B, Example 2-2), in a case where the magnetoresistance effect element 10 was included in the range of the magnetic field generator 21 as viewed from the y-direction, the signal intensity output from the magnetoresistance effect device 100 became particularly stronger. It was confirmed that a relation between the overlapping state and the signal intensity output from the magnetoresistance effect device shows the same tendency even when varying the thickness of the magnetic field generator, a width thereof, a diameter of the magnetoresistance effect element, and the like.

The reason why signal intensity output from the magnetoresistance effect device increases when an overlapping portion between the magnetic field generator 21 and the magnetoresistance effect element 10 exists as viewed from the y-direction is not clear. However, a signal output from the magnetoresistance effect device depends on the variation amount of the resistance value the magnetoresistance effect element 10. Accordingly, it is considered that a high frequency magnetic field with appropriate intensity is applied to the magnetization free layer 12 of the magnetoresistance effect element 10 from an appropriate direction, and thus the variation amount of the resistance value of the magnetoresistance effect element 10 increases.

As described above, a relation between the magnetic field generator 21 and the magnetoresistance effect element 10 has an effect on output characteristics of the magnetoresistance effect device. In the magnetoresistance effect device according to the first embodiment, it is preferable that the thickness of the magnetic field generator 21 is 3 to 50 times thickness of the magnetoresistance effect element 10, and more preferably 5 to 10 times.

In addition, it is preferable that the thickness of the magnetic field generator 21 in the z-direction is 100 nm to 800 nm, more preferably 125 nm to 400 nm, and still more preferably 150 nm to 200 nm.

Figure 17:
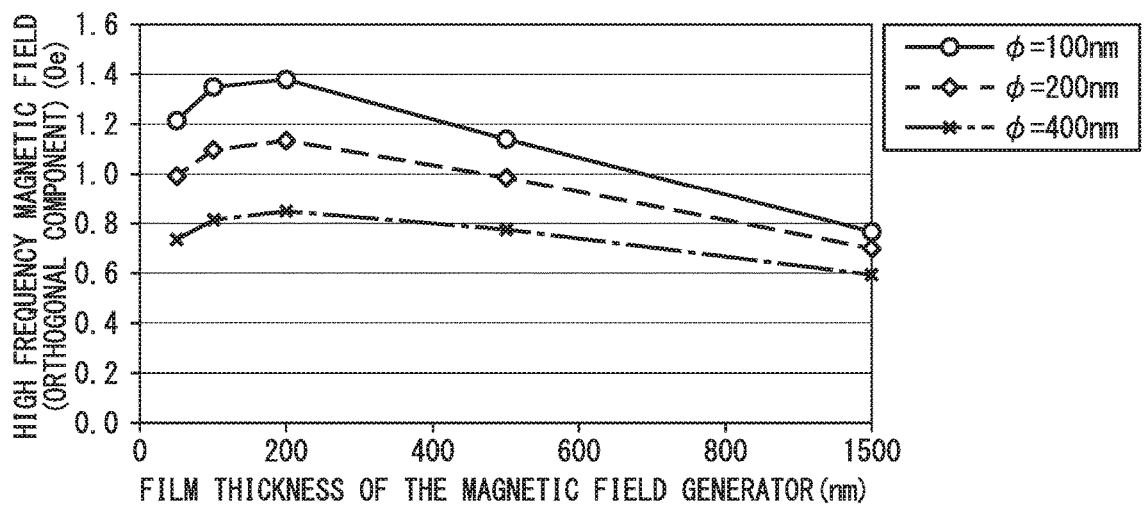
FIG. 17 is a view illustrating an intensity relation of the high frequency magnetic field that is applied to the magnetoresistance effect element when varying the thickness of the magnetic field generator in the magnetoresistance effect device according to the second embodiment.

FIG. 17 is a view illustrating an intensity relation of the high frequency magnetic field that is applied to the magnetoresistance effect element 10 when varying the thickness of the magnetic field generator 21. Examination in FIG. 17 was performed through a simulation by using an electromagnetic field simulator under the following conditions.

The magnetic field generator 21 was provided at a position located on a lateral side by 100 nm in the y-direction from the magnetoresistance effect element 10. The central position of the magnetoresistance effect element 10 in the thickness direction thereof, and the central position of the magnetic field generator 21 in the z-direction were made to match each other. The length of the magnetic field generator 21 was set to 3 μm, and the thickness in the z-direction was set to 100 nm. A frequency of a high frequency current allowed to flow through the magnetic field generator 21 was set to 3.6 GHz, and input power was set to −36 dBm.

In three cases in which a shape of the magnetoresistance effect element 10 in a plan view is set to a circle, and a diameter thereof was set to 100 nmϕ, 200 nmϕ, and 400 nmϕ, a condition, in which an orthogonal component (z-direction) of the high frequency magnetic field applied to the magnetoresistance effect element 10 when changing the thickness of the magnetic field generator 21 in the z-direction becomes the maximum value, was obtained. The height of the magnetoresistance effect element 10 was set to 20 nm.

As illustrated in FIG. 17, the high frequency magnetic field applied to the magnetoresistance effect element 10 showed the maximum value when the thickness of the magnetic field generator 21 was 200 nm. Since the height of the magnetoresistance effect element 10 was set to 20 nm, the thickness of the magnetic field generator 21 in this case corresponds to 10 times the thickness of the magnetoresistance effect element 10.

It is preferable that the width of the magnetic field generator 21 is 50 nm to 500 nm, more preferably 75 nm to 200 nm, and still more preferably 100 nm to 150 nm.

Figure 18:
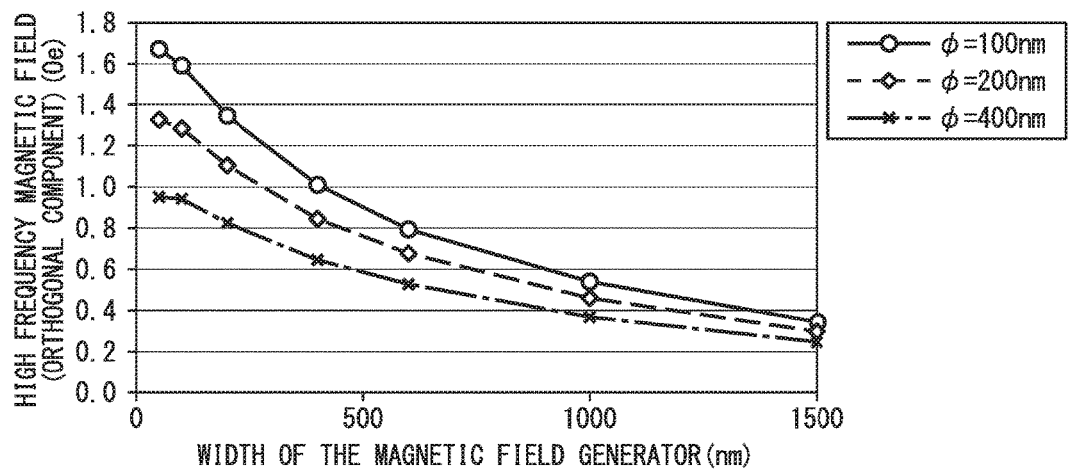
FIG. 18 a view illustrating an intensity relation of the high frequency magnetic field that is applied to the magnetoresistance effect element when varying the width of the magnetic field generator in the magnetoresistance effect device according to the second embodiment.

FIG. 18 is a view illustrating an intensity relation of the high frequency magnetic field that is applied to the magnetoresistance effect element when varying the width of the magnetic field generator 21. Examination in FIG. 18 was performed through a simulation by using an electromagnetic field simulator under the same conditions as in the examination in FIG. 17 except that the thickness of the magnetic field generator 21 was fixed to 100 nm and the width of the magnetic field generator 21 was changed. As illustrated in FIG. 18, as the width of the magnetic field generator 21 was narrowed, the intensity of the high frequency magnetic field applied to the magnetoresistance effect element 10 became stronger.

Figure 19:
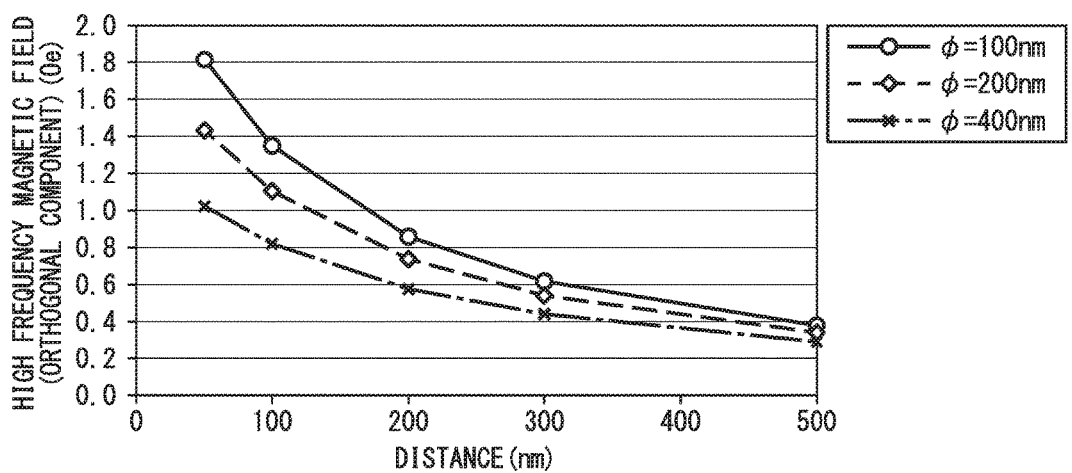
FIG. 19 is a view illustrating an intensity relation of the high frequency magnetic field that is applied to the magnetoresistance effect element when varying a distance between the magnetic field generator and the magnetoresistance effect element in the magnetoresistance effect device according to the second embodiment.

FIG. 19 is a view illustrating an intensity relation of the high frequency magnetic field that is applied to the magnetoresistance effect element when varying a distance between the magnetic field generator 21 and the magnetoresistance effect element 10. Examination in FIG. 19 was performed through a simulation by using an electromagnetic field simulator under the same conditions as in the examination in FIG. 17 except that the thickness of the magnetic field generator 21 was fixed to 100 nm and the distance between the magnetic field generator 21 and the magnetoresistance effect element 10 was changed.

As illustrated in FIG. 19, as the distance between the magnetic field generator 21 and the magnetoresistance effect element 10 is shorter, a magnetic field applied to the magnetoresistance effect element 10 becomes greater. That is, it is preferable that the distance between the magnetic field generator 21 and the magnetoresistance effect element 10 is 500 nm or less, more preferably 200 nm or less, and still more preferably 100 nm or less.

Figure 20:
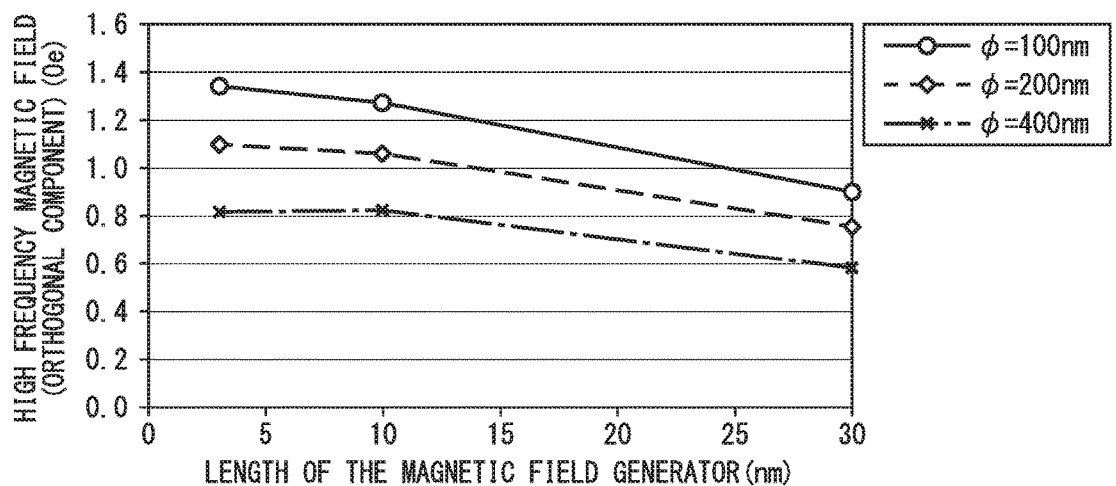
FIG. 20 is a view illustrating an intensity relation of the high frequency magnetic field that is applied to the magnetoresistance effect element when varying a length of the magnetic field generator in the magnetoresistance effect device according to the second embodiment.

In addition, FIG. 20 is a view illustrating an intensity relation of the high frequency magnetic field that is applied to the magnetoresistance effect element when varying a length of the magnetic field generator 21 in the x-direction. Examination in FIG. 20 was performed through a simulation by using an electromagnetic field simulator under the same conditions as in the examination in FIG. 17 except that the thickness of the magnetic field generator 21 was fixed to 100 nm and the length of the magnetic field generator 21 in the x-direction was changed.

As illustrated in FIG. 20, as the length of the magnetic field generator 21 in the x-direction increases, the magnitude of the magnetic field applied to the magnetoresistance effect element 10 decreases.

In addition, even in a case where the magnetic field generator 21 exists in the y-direction of the magnetoresistance effect element 10, a relation between the a direction of the high frequency magnetic field applied to the magnetoresistance effect element 10 and an easy magnetization direction of the magnetization fixed layer 11 does not vary. That is, it is preferable that an angle θ1, which is made by a direction of the high frequency magnetic field that is applied to the magnetization free layer 12 of the magnetoresistance effect element 10 by the magnetic field generator 21 and an easy magnetization direction of the magnetization fixed layer 11 of the magnetoresistance effect element 10, is 5° to 65°, and more preferably 20° to 55°.

Hereinbefore, embodiments of the invention have been described in detail with reference to the accompanying drawings. However, in the respective embodiments, the respective configurations, combinations thereof, and the like are illustrative only, and additions, omissions, substitutions, and other modifications of configurations can be made in a range not departing from the gist of the invention.

Figure 21:
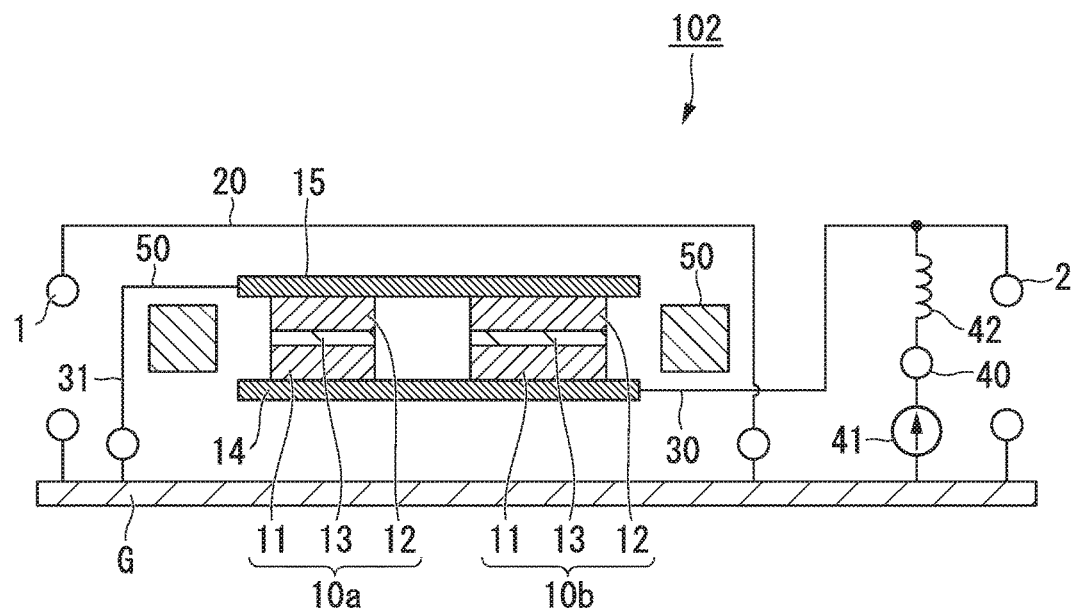
FIG. 21 is a schematic view of a magnetoresistance effect device according to a third embodiment.

For example, as in a magnetoresistance effect device 102 illustrated in FIG. 21, a plurality of magnetoresistance effect elements 10a and 10b may be arranged in parallel in a closed circuit including the power supply 41, the second signal line 30, the third signal line 31, and the ground G. That is, the plurality of magnetoresistance effect elements 10a and 10b are connected to a common upper electrode 15 and a common lower electrode 14.

When ferromagnetic resonance frequencies of the magnetoresistance effect elements 10a and 10b are made to be different from each other, it is possible to broaden a selection frequency band capable of being selected in the magnetoresistance effect device 102. The magnetoresistance effect element 10a and 10b show a great resistance value variation at each ferromagnetic resonance frequency, and the sum of the variations is output from the second port 2. According to this, a frequency in a range in which the ferromagnetic resonance frequencies overlap each other becomes a selection frequency of the magnetoresistance effect device 102, and thus a selection frequency band becomes wide.

The ferromagnetic resonance frequency of the magnetoresistance effect elements 10a and 10b can be controlled by changing the shape of the magnetoresistance effect elements 10a and 10b in a plan view as viewed from the z-direction.

In addition, as illustrated in FIG. 21, the magnetic field applying mechanism 50 may be commonly set to the plurality of magnetoresistance effect elements 10a and 10b, or may be individually provided in the magnetoresistance effect elements 10a and 10b. When the magnetic field applying mechanism 50 is individually provided in the magnetoresistance effect elements 10a and 10b, integration of the magnetoresistance effect device 102 deteriorates, but the degree of freedom in setting of the selection frequency of the magnetoresistance effect device 102 is raised.

Figure 22:
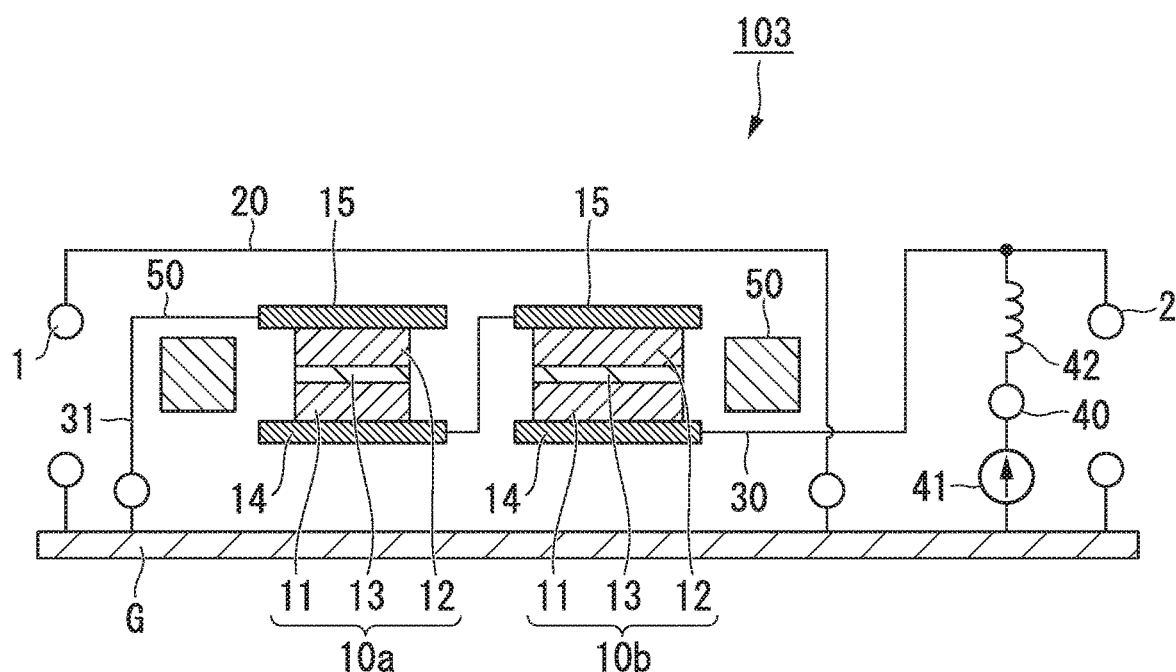
FIG. 22 is a schematic view of a magnetoresistance effect device according to a fourth embodiment.

In addition, for example, as in a magnetoresistance effect device 103 illustrated in FIG. 22, the plurality of magnetoresistance effect elements 10a and 10b may be arranged in series in the closed circuit including the power supply 41, the second signal line 30, the third signal line 31, and the ground G.

When ferromagnetic resonance frequencies of the magnetoresistance effect elements 10a and 10b are made to be different from each other, it is possible to broaden a selection frequency band capable of being selected in the magnetoresistance effect device 102. The magnetoresistance effect element 10a and 10b show a great resistance value variation at each ferromagnetic resonance frequency, and the sum of the variations is output from the second port 2. According to this, a frequency in a range in which the ferromagnetic resonance frequencies overlap each other becomes a selection frequency of the magnetoresistance effect device 103, and thus a selection frequency band becomes wide.

In addition, as illustrated in FIG. 22, the magnetic field applying mechanism 50 may be commonly set to the plurality of magnetoresistance effect elements 10a and 10b, or may be individually provided in the magnetoresistance effect elements 10a and 10b. When the magnetic field applying mechanism 50 is individually provided in the magnetoresistance effect elements 10a and 10b, integration of the magnetoresistance effect device 103 deteriorates, but the degree of freedom in setting of the selection frequency of the magnetoresistance effect device 103 is raised.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: First port
2: Second port
10: Magnetoresistance effect element
11: Magnetization fixed layer
12: Magnetization free layer
13: Spacer layer
14: lower electrode
15: Upper electrode
20: First signal line
21: Magnetic field generator
30: Second signal line
31: Third signal line
40: Direct current application terminal
41: Power supply
42: Inductor
G: Ground
100, 101, 102, 103: Magnetoresistance effect device

What is claimed is:
1. A magnetoresistance effect device, comprising:
a first port configured for a signal to be input;
a second port configured for a signal to be output;
a magnetoresistance effect element including a first ferromagnetic layer, a second ferromagnetic layer, and a spacer layer that is interposed between the first ferromagnetic layer and the second ferromagnetic layer;

a first signal line which is connected to the first port, a high frequency current corresponding to the signal input from the first port flowing through the first signal line, and the first signal line being configured to apply a high frequency magnetic field to the magnetoresistance effect element;

a second signal line that connects the second port and the magnetoresistance effect element to each other; and a direct current application terminal that is capable of being connected to a power supply that applies a direct current or a direct current voltage in a lamination direction of the magnetoresistance effect element, wherein the first signal line includes a magnetic field generator, which extends in a first direction, at a position in the lamination direction of the magnetoresistance effect element or an in-plane direction that is orthogonal to the lamination direction, and the magnetic field generator and the magnetoresistance effect element include an overlapping portion as viewed from the lamination direction in which the magnetic field generator is disposed, or the in-plane direction.

2. The magnetoresistance effect device according to claim 1, wherein, as viewed from the lamination direction in which the magnetic field generator is disposed or the in-plane direction, the magnetic field generator overlaps the entirety of a surface of the magnetoresistance effect element, or the magnetoresistance effect element overlaps the magnetic field generator along a second direction that is orthogonal to the first direction.

3. The magnetoresistance effect device according to claim 2, wherein in a case where the magnetic field generator is provided in the lamination direction of the magnetoresistance effect element, a width of the magnetic field generator is 0.5 to 10 times a width of the magnetoresistance effect element.

4. The magnetoresistance effect device according to claim 3, wherein the width of the magnetic field generator is 100 nm to 800 nm.

5. The magnetoresistance effect device according to claim 4, wherein the thickness of the magnetic field generator is 50 nm to 500 nm.

6. The magnetoresistance effect device according to claim 3, wherein the thickness of the magnetic field generator is 50 nm to 500 nm.

7. The magnetoresistance effect device according to claim 1, wherein in a case where the magnetic field generator is provided in the lamination direction of the magnetoresistance effect element, a width of the magnetic field generator is 0.5 to 10 times a width of the magnetoresistance effect element.

8. The magnetoresistance effect device according to claim 7, wherein the width of the magnetic field generator is 100 nm to 800 nm.

9. The magnetoresistance effect device according to claim 8, wherein the thickness of the magnetic field generator is 50 nm to 500 nm.

10. The magnetoresistance effect device according to claim 7, wherein the thickness of the magnetic field generator is 50 nm to 500 nm.

11. The magnetoresistance effect device according to claim 1, wherein in a case where the magnetic field generator is provided in the in-plane direction of the magnetoresistance effect element, the thickness of the magnetic field generator is 3 to 50 times the thickness of the magnetoresistance effect element.

12. The magnetoresistance effect device according to claim 11, wherein a width of the magnetic field generator is 50 nm to 500 nm.

13. The magnetoresistance effect device according to claim 11, wherein the thickness of the magnetic field generator is 100 nm to 800 nm.

14. The magnetoresistance effect device according to claim 1, wherein a distance between the magnetic field generator and the magnetoresistance effect element is 500 nm or less.

15. The magnetoresistance effect device according to claim 1, wherein an extension length of the magnetic field generator in the first direction is 20 μm or less.

16. The magnetoresistance effect device according to claim 1, wherein an angle made by a direction of the high frequency magnetic field that is applied to the first ferromagnetic layer or the second ferromagnetic layer of the magnetoresistance effect element by the magnetic field generator, and an easy magnetization direction of the first ferromagnetic layer or the second ferromagnetic layer of the magnetoresistance effect element is 5° to 65°.

17. The magnetoresistance effect device according to claim 1, wherein a plurality of the magnetoresistance effect elements are provided in series or in parallel with respect to the direct current application terminal.

18. A high frequency device that uses the magnetoresistance effect device according to claim 1.

* * * * *